US012810806B2

(12) United States Patent
Byun et al.

(10) Patent No.: US 12,810,806 B2
(45) Date of Patent: Nov. 24, 2026

(54) DRIVING CIRCUIT FOR OUTPUTTING GATE SIGNALS BASED ON DIFFERENT RISING TIMING TO A DISPLAY APPARATUS

(71) Applicant: SAMSUNG DISPLAY CO., LTD., Yongin-si (KR)

(72) Inventors: Minwoo Byun, Yongin-si (KR); Minjoo Kim, Yongin-si (KR); Seoni Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 33 days.

(21) Appl. No.: 18/890,901

(22) Filed: Sep. 20, 2024

(65) Prior Publication Data

US 2025/0104651 A1 Mar. 27, 2025

(30) Foreign Application Priority Data

Sep. 25, 2023 (KR) ........................ 10-2023-0128495

(51) Int. Cl.

*G09G 3/3266* (2016.01)
*G09G 3/3233* (2016.01)
*G11C 19/28* (2006.01)

(52) U.S. Cl.

CPC ......... *G09G 3/3266* (2013.01); *G09G 3/3233* (2013.01); *G09G 2300/0408* (2013.01);
(Continued)

(58) Field of Classification Search

CPC ............... G09G 3/3266; G09G 3/3233; G09G 2300/0819; G09G 2300/0842;
(Continued)

(56) References Cited

U.S. PATENT DOCUMENTS 10,810,946 B2 10/2020 Han et al.
11,094,247 B2 8/2021 Lin et al.
(Continued)

FOREIGN PATENT DOCUMENTS

KR 10-2021-0016205 2/2021
KR 10-2481292 12/2022
KR 10-2522536 4/2023

*Primary Examiner* — Adam J Snyder

(74) *Attorney, Agent, or Firm* — F. CHAU & ASSOCIATES, LLC

(57) ABSTRACT

A driving circuit to drive a display apparatus includes first through third driving circuits to respectively receive first through third clock signals for respectively outputting a first gate signal with a gate-on voltage synchronized with rising edge timing of the corresponding clock signal in a first period in which data is supplied to the pixel in a frame period, a second gate signal with a gate-on voltage synchronized with rising edge timing of the corresponding clock signal in a second period for initializing a transistor of the pixel in the frame period, and a third gate signal with a gate-on voltage synchronized with rising edge timing of the corresponding clock signal in a third period for compensating for a threshold voltage of the transistor in the frame period. The rising edge timing of the second clock signal is different from the rising edge timing of the third clock signal.

20 Claims, 32 Drawing Sheets

(52) U.S. Cl.
CPC ............... *G09G 2300/0819* (2013.01); *G09G 2300/0842* (2013.01); *G09G 2300/0861* (2013.01); *G09G 2310/0202* (2013.01); *G09G 2310/0251* (2013.01); *G09G 2310/0262* (2013.01); *G09G 2310/0286* (2013.01); *G09G 2310/08* (2013.01); *G09G 2320/0233* (2013.01); *G09G 2330/025* (2013.01); *G11C 19/28* (2013.01)

(58) Field of Classification Search
CPC ... G09G 2300/0861; G09G 2310/0251; G09G 2310/0262; G09G 2310/0286; G09G 2310/0202; G09G 2310/08; G09G 2300/0408; G09G 2320/0233; G09G 2330/025; G11C 19/28
See application file for complete search history.

(56) References Cited

U.S. PATENT DOCUMENTS

| | | | | |
|---|---|---|---|---|
| 11,238,808 | B2 | 2/2022 | Lee et al. | |
| 11,720,141 | B2 | 8/2023 | Kim et al. | |
| 2008/0030446 | A1* | 2/2008 | Asano | G09G 3/3233 345/87 |
| 2008/0042945 | A1* | 2/2008 | Mutsukura | G09G 3/3233 345/77 |
| 2008/0111766 | A1* | 5/2008 | Uchino | G09G 3/3233 345/55 |
| 2008/0198104 | A1* | 8/2008 | Yamashita | G09G 3/3258 345/77 |
| 2008/0225027 | A1* | 9/2008 | Toyomura | G09G 3/3233 345/204 |
| 2019/0132583 | A1* | 5/2019 | Li | G09G 3/3233 |
| 2019/0164498 | A1* | 5/2019 | Jang | G09G 3/3266 |
| 2020/0211469 | A1* | 7/2020 | Jeon | G09G 3/3266 |
| 2021/0035504 | A1* | 2/2021 | Lee | G09G 3/3266 |
| 2021/0350740 | A1* | 11/2021 | Byun | G09G 3/3233 |
| 2023/0140604 | A1 | 5/2023 | Jeong et al. | |

* cited by examiner

DRIVING CIRCUIT FOR OUTPUTTING GATE SIGNALS BASED ON DIFFERENT RISING TIMING TO A DISPLAY APPARATUS

CROSS-REFERENCE TO RELATED APPLICATION

This patent application claims priority under 35 U.S.C. § 119 to Korean Patent Application No. 10-2023-0128495, filed on Sep. 25, 2023, in the Korean Intellectual Property Office, the disclosure of which is incorporated by reference in its entirety herein.

1. Technical Field

Embodiments of the disclosure are directed to a driving circuit for a display apparatus, and more particularly, to a gate driving circuit for outputting a gate signal to a pixel and a display apparatus including the same.

2. Discussion of Related Art

A display apparatus typically includes a display panel including a plurality of pixels for displaying images, a gate driving circuit for driving gate lines of the display panel, a data driving circuit for driving data lines of the display panel, and a controller for controlling the gate and data driving circuits. The gate driving circuit may include stages connected to gate lines, and the stages may supply gate signals to the gate lines connected to the stages, in response to signals from the controller. However, a luminance deviation may be present between even rows and odd rows of the pixels that reduces a quality of images perceived by a viewer.

SUMMARY

At least one embodiment of the disclosure includes a display apparatus having an increased display quality by minimizing a luminance deviation thereof. Technical solutions to be achieved by the disclosure are not limited to the technical solutions mentioned above, and other technical solutions not mentioned above may be clearly understood from the description of the disclosure by those of ordinary skill in the art.

According to an embodiment, a driving circuit for outputting at least one gate signal to a pixel of display panel includes a first driving circuit, a second driving circuit and a third driving circuit. The first driving circuit is configured to receive a first clock signal and output a first gate signal with a gate-on voltage synchronized with rising edge timing of the first clock signal in a first period in which data is supplied to the pixel in a frame period. The second driving circuit is configured to receive a second clock signal and output a second gate signal with a gate-on voltage synchronized with rising edge timing of the second clock signal in a second period for initializing a driving transistor of the pixel in the frame period. The third driving circuit is configured to receive a third clock signal and output a third gate signal with a gate-on voltage synchronized with rising edge timing of the third clock signal in a third period for compensating for a threshold voltage of the driving transistor of the pixel in the frame period. The rising edge timing of the second clock signal is different from the rising edge timing of the third clock signal.

In an embodiment, the first driving circuit may include a plurality of first stages each configured to output the first gate signal to a corresponding pixel row of the display panel, the second driving circuit may include a plurality of second stages each configured to simultaneously output the second gate signal to a corresponding pair of pixel rows of the display panel, and the third driving circuit may include a plurality of third stages each configured to simultaneously output the third gate signal to a corresponding pair of pixel rows of the display panel.

In an embodiment, the second period may precede the first period, and the third period may be between the first period and the second period.

In an embodiment, the driving circuit may further include a fourth driving circuit configured to receive a fourth clock signal and output a fourth gate signal with a gate-on voltage synchronized with rising edge timing of the fourth clock signal in at least a portion of the second period and an emission period of the pixel, wherein a light emitting device of the pixel may be initialized in the second period, and the rising edge timing of the fourth clock signal may be same as the rising edge timing of the second clock signal or the rising edge timing of the third clock signal.

In an embodiment, the fourth driving circuit may include a plurality of fourth stages each configured to simultaneously output the fourth gate signal to a corresponding pair of pixel rows of the display panel.

In an embodiment, the driving circuit may further include a fifth driving circuit configured to receive a fifth clock signal and output a fifth gate signal with a gate-on voltage synchronized with rising edge timing of the fifth clock signal in the third period and an emission period of the pixel, wherein the rising edge timing of the fifth clock signal may be same as the rising edge timing of the second clock signal or the rising edge timing of the third clock signal.

In an embodiment, the fifth driving circuit may include a plurality of fifth stages each configured to simultaneously output the fifth gate signal to a corresponding pair of pixel rows of the display panel.

In an embodiment, the rising edge timing of the second clock signal may be later than the rising edge timing of the third clock signal.

In an embodiment, the rising edge timing of the second clock signal may be 0.5 μs, and the rising edge timing of the third clock signal may be 1.5 μs.

In an embodiment, the rising edge timing of the third clock signal may be later than the rising edge timing of the second clock signal.

In an embodiment, the rising edge timing of the third clock signal may be 0.5 μs, and the rising edge timing of the second clock signal may be 1.5 μs.

In an embodiment, a signal width of the first gate signal output to an odd pixel row of the display panel may be equal to a signal width of the first gate signal output to an even pixel row of the display panel.

In an embodiment, the rising edge timing of the first clock signal may precede the rising edge timing of the second clock signal and the rising edge timing of the third clock signal.

According to an embodiment, a driving circuit for outputting at least one gate signal to a pixel of a display panel includes a first driving circuit, a second driving circuit, and a third driving circuit. The first driving circuit is configured to receive a first clock signal and output a first gate signal with a gate-on voltage synchronized with rising edge timing of the first clock signal in a first period in which data is supplied to the pixel in a frame period. The second driving circuit is configured to receive a second clock signal and output a second gate signal with a gate-on voltage synchronized with rising edge timing of the second clock signal in a second period for initializing a driving transistor of the pixel in the frame period. The third driving circuit is configured to receive a third clock signal and output a third gate signal with a gate-on voltage synchronized with rising edge timing of the third clock signal in a third period for compensating for a threshold voltage of the driving transistor of the pixel in the frame period. In the first period, a signal width of the first gate signal output to an odd pixel row of the display panel is different from a signal width of the first gate signal output to an even pixel row of the display panel.

In an embodiment, the rising edge timing of the second clock signal and the rising edge timing of the third clock signal may be the same as each other, and the rising edge timing of the first clock signal may precede the rising edge timing of the second clock signal and the rising edge timing of the third clock signal.

In an embodiment, the first driving circuit may include a plurality of first stages each configured to output the first gate signal to a corresponding pixel row of the display panel, the second driving circuit may include a plurality of second stages each configured to simultaneously output the second gate signal to a corresponding pair of pixel rows of the display panel, and the third driving circuit may include a plurality of third stages each configured to simultaneously output the third gate signal to a corresponding pair of pixel rows of the display panel.

In an embodiment, the driving circuit may further include a fourth driving circuit configured to receive a fourth clock signal and output a fourth gate signal with a gate-on voltage synchronized with a rising edge timing of the fourth clock signal in at least a portion of the second period and an emission period of the pixel, wherein a light emitting device of the pixel may be initialized in the second period, and the rising edge timing of the fourth clock signal may be the same as the rising edge timing of the second clock signal.

In an embodiment, the fourth driving circuit may include a plurality of fourth stages each configured to simultaneously output the fourth gate signal to a corresponding pair of pixel rows of the display panel.

In an embodiment, the driving circuit may further include a fifth driving circuit configured to receive a fifth clock signal and output a fifth gate signal with a gate-on voltage synchronized with rising edge timing of the fifth clock signal in the third period and an emission period of the pixel, wherein the rising edge timing of the fifth clock signal may be same as the rising edge timing of the second clock signal.

In an embodiment, the fifth driving circuit may include a plurality of fifth stages each configured to simultaneously output the fifth gate signal to a corresponding pair of pixel rows of the display panel.

According to an embodiment, a display device may include a driving circuit according to the embodiments of the disclosure.

In an embodiment, the display apparatus includes a display panel; a driving circuit according to the embodiments of the disclosure. The display apparatus includes a controller configured to provide at least the first clock signal, the second clock signal and the third clock signal to the driving circuit, wherein the rising edge timing of the second clock signal is different from the rising edge timing of the third clock signal, or wherein, in the first period, a signal width of the first gate signal output to an odd pixel row of the display panel is different from a signal width of the first gate signal output to an even pixel row of the display panel.

BRIEF DESCRIPTION OF THE DRAWINGS

Aspects and features of certain embodiments of the disclosure will become more apparent from the following description taken in conjunction with the accompanying drawings, in which.

DETAILED DESCRIPTION

Figure 1A:
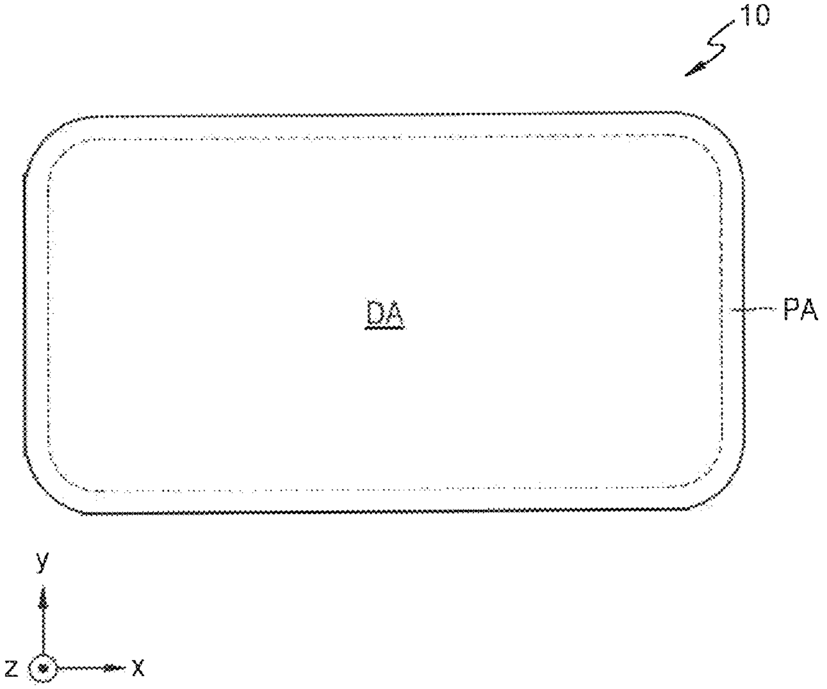
FIGS. 1A and 1B are diagrams schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise; and the term "and/or" includes any and all combinations of one or more of the associated listed items.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

In the following embodiments, when X and Y are connected to each other, X and Y may be electrically connected to each other, X and Y may be functionally connected to each other, or X and Y may be physically connected to each other, with or without at least one intervening element. Here, X and Y may be target objects (e.g., apparatuses, devices, circuits, lines, electrodes, terminals, conductive layers, or layers). Thus, the disclosure is not limited to a certain connection relationship.

For example, when X and Y are electrically connected to each other, X and Y may be connected to each other directly, or one or more devices (e.g., switches, transistors, capacitors, inductors, resistors, or diodes) enabling the electrical connection between X and Y may be connected between X and Y.

In the following embodiments, "ON" used in connection with a device state may refer to an activated state of the device, and "OFF" may refer to a deactivated state of the device. "ON" used in connection with a signal received by a device may refer to a signal activating the device, and "OFF" may refer to a signal deactivating the device. The device may be activated by a high-level voltage or a low-level voltage. For example, a P-channel transistor (P-type transistor) may be activated by a low-level voltage, and an N-channel transistor (N-type transistor) may be activated by a high-level voltage. Thus, it should be understood that "ON" voltages for the P-type transistor and the N-type transistor are opposite (low versus high) voltage levels.

Also, herein, the x direction, the y direction, and the z direction are not limited to the directions along three axes of the rectangular coordinate system and may be interpreted in a broader sense. For example, the x direction, the y direction, and the z direction may be perpendicular to one another or may represent different directions that are not perpendicular to one another.

A display apparatus according to an embodiment of the disclosure may be an apparatus displaying a moving image or a still image and may be used as a display screen of various products such as televisions, notebook computers, monitors, billboards, and Internet of Things (IoT) as well as portable electronic apparatuses such as mobile phones, smart phones, tablet personal computers (PCs), mobile communication terminals, electronic notebooks, electronic books, portable multimedia players (PMPs), navigation, and Ultra Mobile PCs (UMPCs). Also, a display apparatus 10 according to an embodiment may be used in wearable devices such as smart watches, watch phones, glasses-type displays, and head-mounted displays (HMDs). Also, a display apparatus 10 according to an embodiment may be used as a center information display (CID) arranged at a vehicle's instrument panel or a vehicle's center fascia or dashboard, a room mirror display replacing a vehicle's side mirror, or a display arranged at a rear side of a vehicle's front seat as an entertainment for a vehicle's rear seat. Also, the display apparatus may be a flexible apparatus.

Figure 1B:
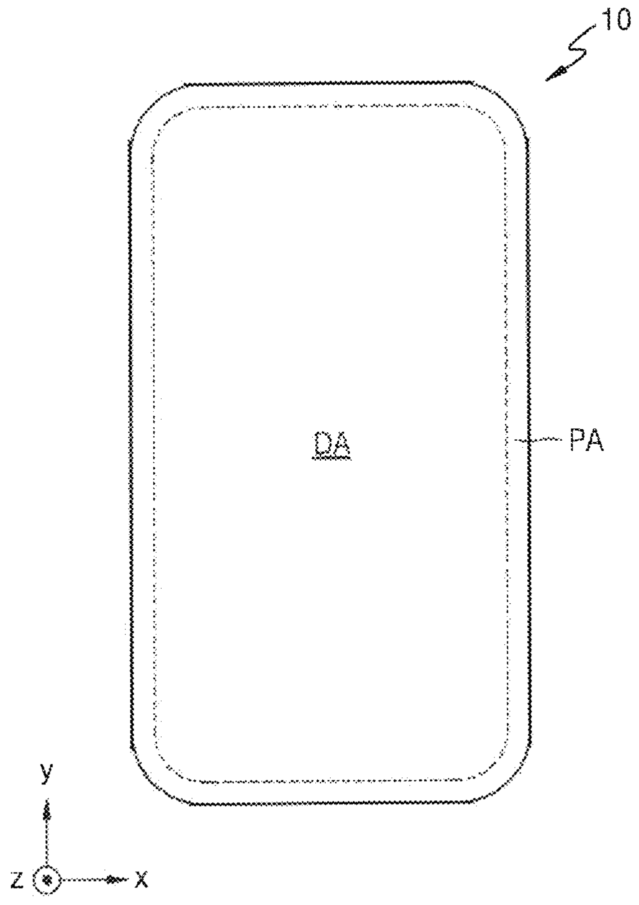
Figure 2:
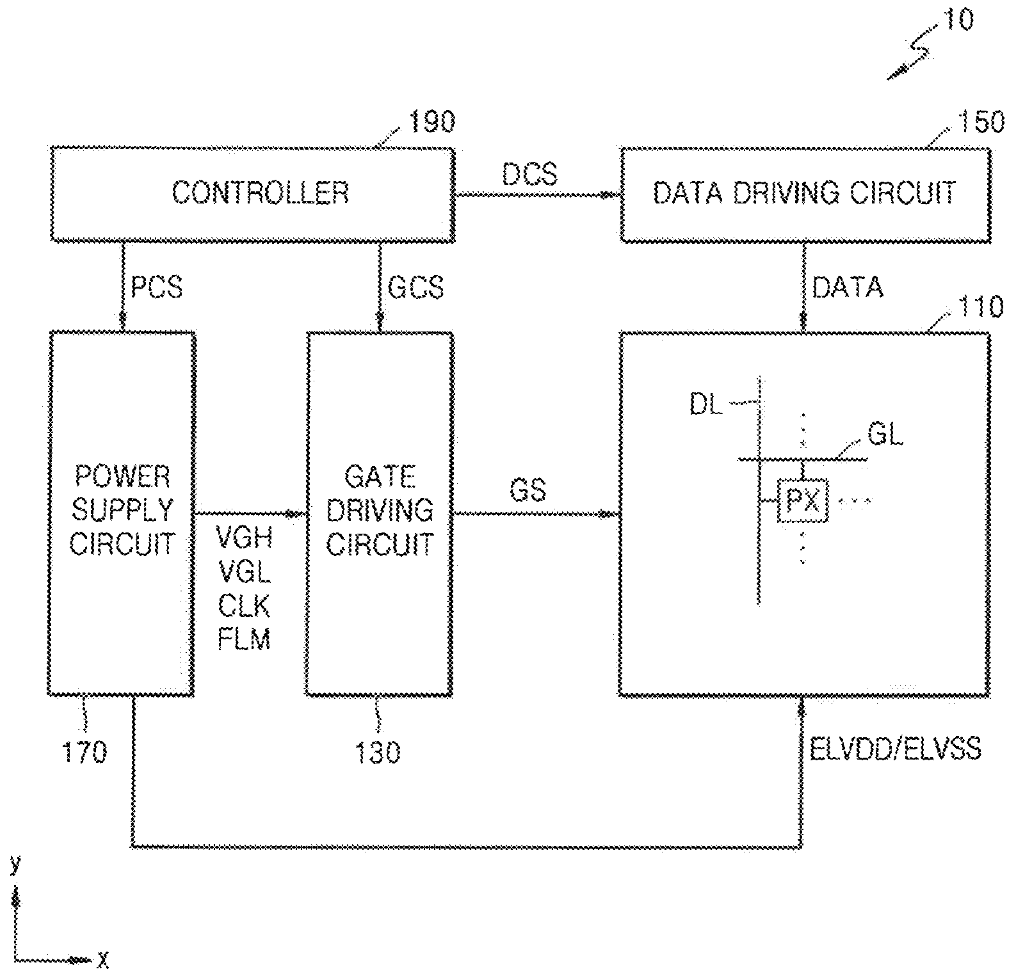
FIG. 2 is a diagram schematically illustrating a display apparatus according to an embodiment.

FIGS. 1A and 1B are diagrams schematically illustrating a display apparatus according to an embodiment. FIG. 2 is a diagram schematically illustrating a display apparatus according to an embodiment.

Referring to FIGS. 1A and 1B, a display apparatus 10 may include a display area DA for displaying an image and a peripheral area PA located outside the display area DA. The display area DA may be entirely surrounded by the peripheral area PA.

In a plan view, the display area DA may have a rectangular shape. In other embodiments, the display area DA may have a polygonal shape such as a triangular, pentagonal, or hexagonal shape, a circular shape, an elliptical shape, an atypical shape, or the like. A corner of the edge of the display area DA may be rounded. In an embodiment, as illustrated in FIG. 1A, the display apparatus 10 may include a display area DA having a shape in which a length in the x direction is greater than a length in the y direction. In another embodiment, as illustrated in FIG. 1B, the display apparatus 10 may include a display area DA having a shape in which a length in the y direction is greater than a length in the x direction.

Referring to FIG. 2, the display apparatus 10 according to an embodiment may include a pixel area 110 (e.g., a display panel), a gate driving circuit 130, a data driving circuit 150, a power supply circuit 170, and a controller 190 (e.g., a control circuit).

The pixel area 110 may be located in the display area DA. As illustrated in FIG. 2, a plurality of pixels PX may be arranged in the pixel area 110. A plurality of gate lines GL, a plurality of data lines DL, and a plurality of pixels PX connected thereto may be arranged in the pixel area 110. The plurality of pixels PX may be arranged in various forms such as a stripe arrangement, a pentile arrangement, a diamond arrangement, and a mosaic arrangement to display an image. Each pixel PX may include an organic light emitting diode OLED as a display element (light emitting element), and the organic light emitting diode OLED may be connected to a pixel circuit. The pixel circuit may include a plurality of transistors and at least one capacitor. The pixel PX may emit, for example, red, green, blue, or white light from the organic light emitting diode OLED. Each pixel PX may be connected to at least one corresponding gate line among the plurality of gate lines GL and a corresponding data line among the plurality of data lines DL.

Each of the gate lines GL may extend in the x direction (a pixel row direction) to be connected to the pixels PX located in the same pixel row. Each of the gate lines GL may be configured to transmit a gate signal GS to the pixels PX in the same pixel row. Each of the data lines DL may extend in the y direction (a pixel column direction) to be connected to the pixels PX located in the same pixel column. Each of the data lines DL may be configured to transmit a data signal GS to each of the pixels PX in the same pixel column in synchronization with a gate signal. Each pixel PX may be connected to a driving voltage line PL (see FIG. 3) to receive a driving voltage ELVDD. Each of the driving voltage lines PL may extend in the y direction to be connected to the pixels PX located in the same column. Hereinafter, for convenience of description, a pixel row may be referred to as a row, and a pixel column may be referred to as a column.

Each of the pixel circuits driving the pixels PX may be electrically connected to peripheral circuits arranged in the peripheral area PA. Various conductive lines for transmitting electrical signals to be applied to the display area DA, peripheral circuits electrically connected to pixel circuits, and/or pads to which a printed circuit board or a driver IC chip is attached may be located in the peripheral area PA. For example, the gate driving circuit 130, the data driving circuit 150, the power supply circuit 170, and the controller 190 may be located in the peripheral area PA.

In an embodiment, the peripheral area PA is a non-display area in which pixels PX are not arranged. In another embodiment, a portion of the peripheral area PA is implemented as a display area DA. For example, a plurality of pixels PX may be arranged in at least one corner of the peripheral area PA to overlap the peripheral circuit. Accordingly, a dead area may be reduced and the display area DA may be extended.

The gate driving circuit 130 may be connected to a plurality of gate lines GL, may generate gate signals GS in response to a control signal GCS from the controller 190, and may sequentially supply the gate signals GS to the gate lines GL. A gate line GL may be connected to the gate of the transistor included in the pixel PX. The gate signal GS may be a gate control signal for controlling turn-on and turn-off of a transistor whose gate is connected to the gate line GL. The gate signal GS may be a signal including a gate-on voltage at which the transistor is turned on and a gate-off voltage at which the transistor is turned off. The gate-on voltage may be a high-level voltage (first-level voltage) or a low-level voltage (second-level voltage).

Figure 3:
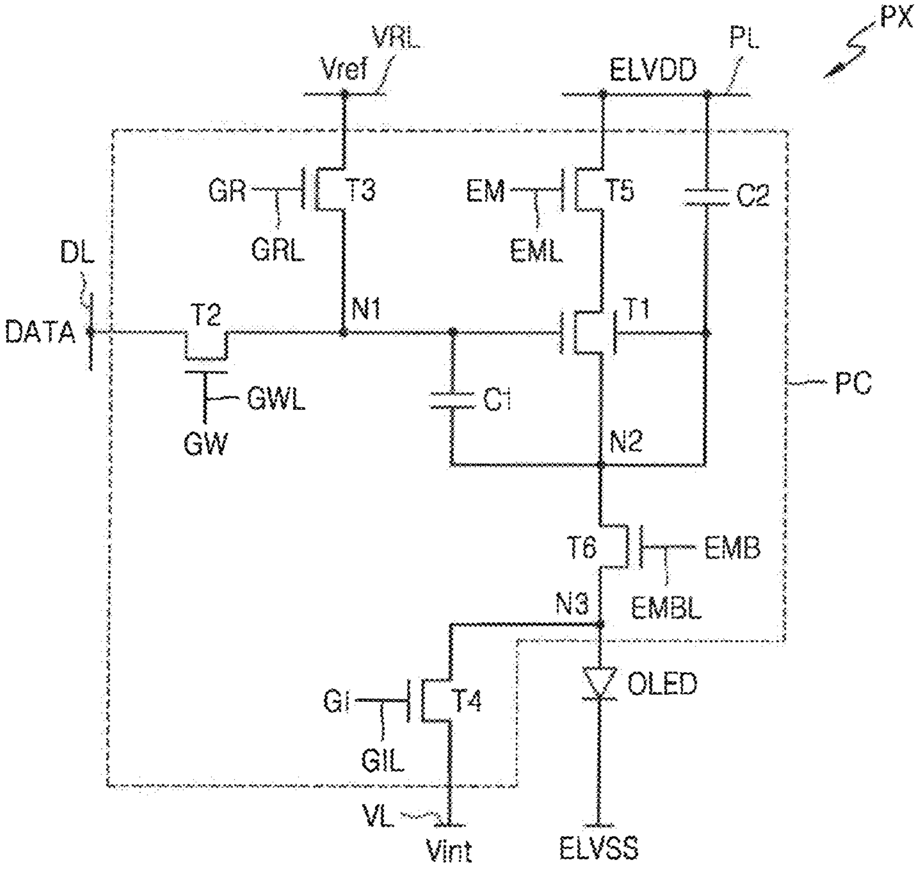
FIG. 3 is an equivalent circuit diagram of a pixel according to an embodiment.

FIG. 2 illustrates that the pixel PX is connected to one gate line GL. However, this is merely an example, since as illustrated in FIG. 3, the pixel PX may be connected to two or more gate lines and the gate driving circuit 130 may supply two or more gate signals GS with different timings at which a gate-on voltage is applied, to the corresponding gate lines.

The data driving circuit 150 may be connected to a plurality of data lines DL and may supply data signals DATA to the data lines DL in response to a control signal DCS from the controller 190. The data signal DATA supplied to the data line DL may be supplied to the pixel PX to which the gate signal GS is supplied. The data driving circuit 150 may convert input image data with a gradation input from the controller 190, into a data signal DATA in the form of a voltage or current.

In response to a control signal PCS from the controller 190, the power supply circuit 170 may generate voltages used for driving the pixel PX and signals and voltages necessary for driving the gate driving circuit 130. The power supply circuit 170 may generate a driving voltage ELVDD and a common voltage ELVSS and supply the same to the pixels PX. The driving voltage ELVDD may be a high-level voltage provided to a terminal of a driving transistor connected to a first electrode (pixel electrode or anode) of the display element included in the pixel PX. The common voltage ELVSS may be a low-level voltage provided to a second electrode (opposite electrode or cathode) of the display element included in the pixel PX. The power supply circuit 170 may generate at least one start signal FLM, at least one clock signal CLK, and at least one voltage signal VGH or VGL and supply the same to the gate driving circuit 130. The power supply circuit 170 may generate signals and voltages for driving the data driving circuit 150 and supply the same to the data driving circuit 150. For example, the power supply circuit 170 may generate at least one start signal, at least one clock signal, and at least one voltage signal and supply the same to the data driving circuit 150.

FIG. 2 illustrates that the power supply circuit 170 generates voltages for driving the pixel PX and signals and voltages for driving the gate driving circuit 130 and the data driving circuit 150. However, embodiments are not limited thereto. For example, a circuit generating a clock signal may be provided separately from the power supply circuit 170 to generate and supply a clock signal for driving the gate driving circuit 130 and the data driving circuit 150.

The controller 190 may generate control signals GCS, DCS, and PCS based on signals input from outside and supply the same to the gate driving circuit 130, the data driving circuit 150, and the power supply circuit 170.

The display apparatus 10 may include a display panel, and the display panel may include a substrate. Pixels PX may be arranged in the display area DA of the substrate. Some or all of the gate driving circuit 130 may be directly formed in the peripheral area PA of the substrate in the process of forming transistors constituting a pixel circuit in the display area DA of the substrate. Each of the data driving circuit 150, the power supply circuit 170, and the controller 190 may be formed as a separate integrated circuit chip or a single integrated circuit chip and disposed over a flexible printed circuit board (FPCB) electrically connected to a terminal unit arranged on one side of the substrate. In other embodiments, the data driving circuit 150, the power supply circuit 170, and the controller 190 may be directly disposed over the substrate by using a chip-on-glass (COG) or chip-on-plastic (COP) method.

In an embodiment, a plurality of transistors included in the pixel circuits of the display area DA and a plurality of transistors included in the peripheral circuit of the peripheral area PA, for example, a plurality of transistors included in the gate driving circuit 130, may be N-type oxide thin film transistors. The plurality of transistors included in the peripheral circuit of the peripheral area PA may be formed through the same process as the plurality of transistors included in the pixel circuits of the display area DA. In another embodiment, the plurality of transistors included in the pixel circuits of the display area DA and the plurality of transistors included in the peripheral circuit of the peripheral area PA may be P-type silicon thin film transistors. In another embodiment, the plurality of transistors included in the pixel circuits of the display area DA may be N-type oxide thin film transistors, and the plurality of transistors included in the peripheral circuit of the peripheral area PA may be P-type silicon thin film transistors.

In the oxide thin film transistor, a semiconductor layer may include an oxide. The oxide semiconductor may include a Zn oxide-based material such as a Zn oxide, an In—Zn oxide, or a Ga—In—Zn oxide. In some embodiments, the oxide semiconductor may be an In—Ga—Zn—O (IGZO) semiconductor including a metal such as indium (In) and gallium (Ga) in ZnO. In some embodiments, the oxide semiconductor may be an In—Sn—Ga—Zn—O (ITGZO) semiconductor. In an embodiment, the oxide thin film transistor may be a low-temperature polycrystalline oxide (LTPO) thin film transistor. The silicon thin film transistor may be a low-temperature polysilicon (LTPS) thin film transistor in which the semiconductor layer includes amorphous silicon or polysilicon.

Figure 4A:
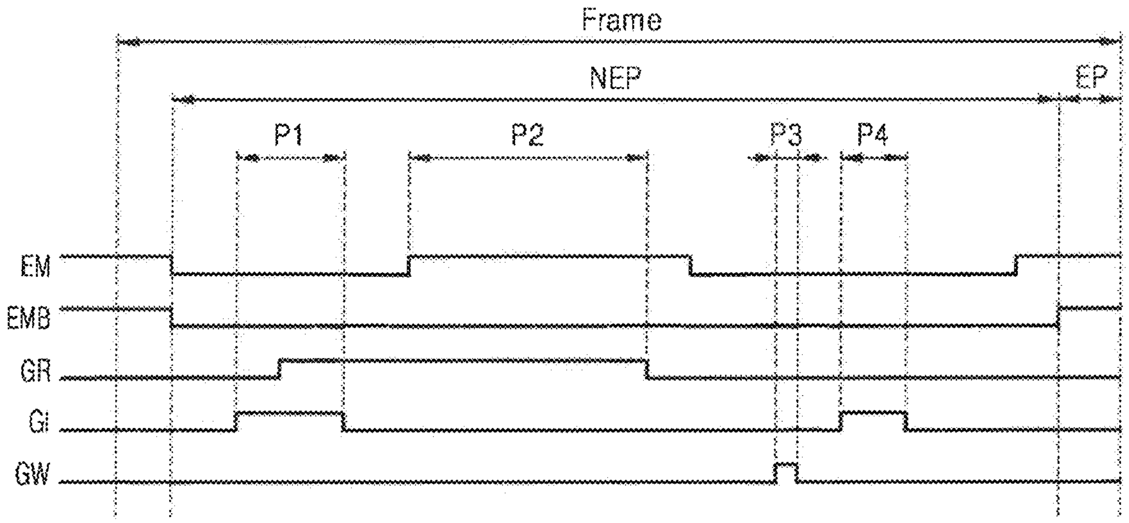
FIGS. 4A and 4B are diagrams illustrating signals for describing an operation of the pixel illustrated in FIG. 3.
Figure 4B:
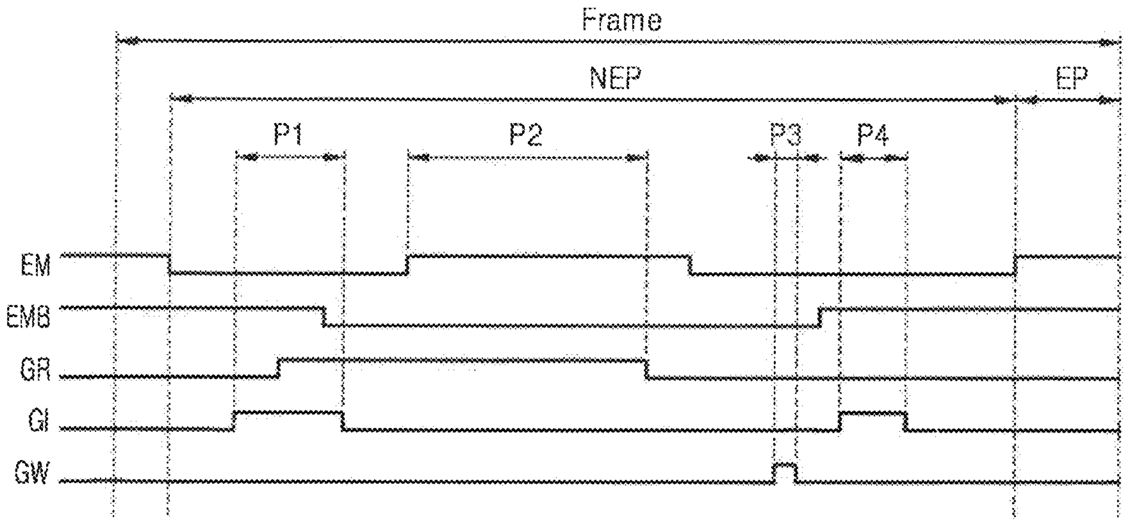

FIG. 3 is an equivalent circuit diagram of a pixel according to an embodiment. However, the disclosure is not limited to the pixel of FIG. 3 but other circuits for a pixel may be used. FIGS. 4A and 4B are diagrams illustrating signals for describing an operation of the pixel illustrated in FIG. 3.

Referring to FIG. 3, a pixel PX may include a pixel circuit PC and an organic light emitting diode OLED as a display element connected to the pixel circuit PC.

The pixel PX may be connected to a first gate line GWL configured to transmit a first gate signal GW, a second gate line GIL configured to transmit a second gate signal GI, a third gate line GRL configured to transmit a third gate signal GR. In an embodiment, the pixel PX may be connected to a fourth gate line EML configured to transmit a fourth gate signal EM and/or a fifth gate line EMBL configured to transmit a fifth gate signal EMB, and a data line DL configured to transmit a data signal. Because the light emission of the pixel PX is controlled by the fourth gate signal EM and the fifth gate signal EMB, the fourth gate signal EM and the fifth gate signal EMB may be referred to as an emission control signal and the fourth gate line EML and the fifth gate line EMBL may be referred to as an emission control line. Also, the pixel PX may be connected to a driving voltage line PL configured to transmit a driving voltage ELVDD, a reference voltage line VRL configured to transmit a reference voltage Vref, and an initialization voltage line VL configured to transmit an initialization voltage Vint.

In an embodiment, a plurality of transistors included in the pixel circuit PC may be N-type oxide thin film transistors. The oxide thin film transistor may be a low-temperature polycrystalline oxide (LTPO) thin film transistor in which a semiconductor layer includes an oxide. However, this is merely an example and the N-type transistors are not limited thereto. For example, the semiconductor layer included in the N-type transistor may include an inorganic semiconductor (e.g., amorphous silicon or polysilicon) or an organic semiconductor.

The pixel circuit PC may include first to sixth transistors T1 to T6 and first and second capacitors C1 and C2. The first transistor T1 may be a driving transistor outputting a driving current corresponding to a data signal, and the second to sixth transistors T2 to T6 may be switching transistors configured to transmit signals. A first terminal (first electrode) and a second terminal (second electrode) of each of the first to sixth transistors T1 to T6 may be a source or a drain depending on the voltages of the first terminal and the second terminal. For example, depending on the voltages of the first terminal and the second terminal, the first terminal may be a drain and the second terminal may be a source, or the first terminal may be a source and the second terminal may be a drain. A node to which a first gate of the first transistor T1 is connected may be referred to as a first node N1, and a node to which a second terminal of the first transistor T1 is connected may be referred to as a second node N2.

The first transistor T1 may be connected between the driving voltage line PL and the second node N2. The first transistor T1 may include a gate, a first terminal, and a second terminal connected to the second node N2. The first transistor T1 may include a first gate connected to the first node N1. The first transistor T1 may further include a second gate connected to the second terminal thereof. The first gate and the second gate may be arranged on different layers to face each other. For example, the first gate and the second gate of the first transistor T1 may be located to face each other with a semiconductor layer therebetween.

The first gate of the first transistor T1 may be connected to the second terminal of the second transistor T2, the first terminal of the third transistor T3, and the first capacitor C1. The second gate of the first transistor T1 may be connected to the first terminal of the sixth transistor T6, the first capacitor C1, and the second capacitor C2. The first terminal of the first transistor T1 may be connected to the driving voltage line PL via the fifth transistor T5, and the second terminal thereof may be connected to the pixel electrode of the organic light emitting diode OLED via the sixth transistor T6. The first terminal of the first transistor T1 may be connected to the second terminal of the fifth transistor T5. The second terminal of the first transistor T1 may be connected to the first terminal of the sixth transistor T6, the first capacitor C1, and the second capacitor C2. The first transistor T1 may receive a data signal DATA according to a switching operation of the second transistor T2 to control the amount of a driving current flowing through the organic light emitting diode OLED.

The second transistor T2 (a data writing transistor) may be connected between the data line DL and the first gate of the first transistor T1. The second transistor T2 may include a gate connected to the first gate line GWL, a first terminal connected to the data line DL, and a second terminal connected to the first node N1. The second terminal of the second transistor T2 may be connected to the first gate of the first transistor T1, the first terminal of the third transistor T3, and the first capacitor C1. The second transistor T2 may be turned on by the first gate signal GW received through the first gate line GWL, to electrically connect the data line DL with the first node N1 and transmit the data signal DATA received through the data line DL, to the first node N1.

The third transistor T3 (a first initialization transistor) may be connected between the first gate of the first transistor T1 and the reference voltage line VRL. The third transistor T3 may include a gate connected to the third gate line GRL, a first terminal connected to the first node N1, and a second terminal connected to the reference voltage line VRL. The first terminal of the third transistor T3 may be connected to the first gate of the first transistor T1, the second terminal of the second transistor T2, and the first capacitor C1. The third transistor T3 may be turned on by the third gate signal GR received through the third gate line GRL, to transmit the reference voltage Vref received through the reference voltage line VRL, to the first node N1. For example, the third gate signal GR may be applied to the gate of the third transistor T3.

The fourth transistor T4 (a second initialization transistor or a reset transistor) may be connected between the sixth transistor T6 and the initialization voltage line VL. The fourth transistor T4 may be connected between the organic light emitting diode OLED and the initialization voltage line VL. The fourth transistor T4 may include a gate connected to the second gate line GIL, a first terminal connected to a third node N3, and a second terminal connected to the initialization voltage line VL. The first terminal of the fourth transistor T4 may be connected to the second terminal of the sixth transistor T6 and the organic light emitting diode OLED. The fourth transistor T4 may be turned on by the second gate signal GI received through the second gate line GIL, to transmit the initialization voltage Vint received through the initialization voltage line VL, to the third node N3. For example, the second gate signal GI may be applied to the gate of the fourth transistor T4.

The fifth transistor T5 (a first emission control transistor) may be connected between the driving voltage line PL and the first transistor T1. The fifth transistor T5 may include a gate connected to the fourth gate line EML, a first terminal connected to the driving voltage line PL, and a second terminal connected to the first terminal of the first transistor T1. The fifth transistor T5 may be turned on or off according to the fourth gate signal EM received through the fourth gate line EML. For example, the fourth gate signal EM may be applied to the gate of the fifth transistor T5.

The sixth transistor T6 (a second emission control transistor) may be connected between the first transistor T1 and the organic light emitting diode OLED. The sixth transistor T6 may be connected between the second node N2 and the third node N3. The sixth transistor T6 may include a gate connected to the fifth gate line EMBL, a first terminal connected to the second node N2, and a second terminal connected to the third node N3. The first terminal of the sixth transistor T6 may be connected to the second terminal of the first transistor T1, the first capacitor C1, and the second capacitor C2. The second terminal of the sixth transistor T6 may be connected to the first terminal of the fourth transistor T4 and the pixel electrode of the organic light emitting diode OLED. The sixth transistor T6 may be turned on or off according to the fifth gate signal EMB received through the fifth gate line EMBL. For example, the fifth gate signal EMB may be applied to the gate of the sixth transistor T6.

The first capacitor C1 may be connected between the first gate of the first transistor T1 and the second terminal of the first transistor T1. A first electrode of the first capacitor C1 may be connected to the first node N1, and a second electrode thereof may be connected to the second node N2. The first electrode of the first capacitor C1 may be connected to the first gate of the first transistor T1, the second terminal of the second transistor T2, and the first terminal of the third transistor T3. A second electrode of the first capacitor C1 may be connected to the second terminal and the second gate of the first transistor T1, the second electrode of the second capacitor C2, and the first terminal of the sixth transistor T6. The first capacitor C1 may be a storage capacitor and may store a threshold voltage of the first transistor T1 and a voltage corresponding to the data signal DATA.

The second capacitor C2 may be connected between the driving voltage line PL and the second node N2. The first electrode of the second capacitor C2 may be connected to the driving voltage line PL. A second electrode of the second capacitor C2 may be connected to the second terminal and the second gate of the first transistor T1, the second electrode of the first capacitor C1, and the first terminal of the sixth transistor T6. In an embodiment, the capacitance of the first capacitor C1 is greater than the capacitance of the second capacitor C2.

The organic light emitting diode OLED may be connected to the first transistor T1 through the sixth transistor T6. The organic light emitting diode OLED may include a pixel electrode (anode) connected to the third node N3 and an opposite electrode (cathode) facing the pixel electrode, and the opposite electrode may receive a common voltage ELVSS. The opposite electrode may be a common electrode common to a plurality of pixels PX.

The pixel PX may display an image in units of frames or frame periods. Referring to FIG. 4A, a frame may include a non-emission period NEP in which the pixel PX does not emit light and an emission period EP in which the pixel PX emits light. The non-emission period NEP may include a first period P1, a second period P2 and a third period P3. In an embodiment, the non-emission period NEP may include a fourth period P4.

Each of the first gate signal GW, the second gate signal GI, the third gate signal GR, the fourth gate signal EM, and the fifth gate signal EMB may have a high-level voltage (a first-level voltage) in some periods and may have a low-level voltage (a second-level voltage) in some periods. Here, the high-level voltage may be a gate-on voltage for turning on the transistor, and the low-level voltage may be a gate-off voltage for turning off the transistor.

The first period P1 may be a first initialization period for initializing the first node N1 to which the first gate of the first transistor T1 is connected and the third node N3 to which the pixel electrode of the organic light emitting diode OLED is connected. In the first period P1, the second gate signal GI with a gate-on voltage is supplied (applied) to the second gate line GIL, and the third gate signal GR with a gate-on voltage may be supplied to the third gate line GRL. In the first period P1, the first gate signal GW, the fourth gate signal EM, and the fifth gate signal EMB may be supplied with a gate-off voltage.

The fourth transistor T4 may be turned on by the second gate signal GI, and the third transistor T3 may be turned on by the third gate signal GR. The first node N1, that is, the first gate of the first transistor T1, may be initialized to the reference voltage Vref by the turned-on third transistor T3. The third node N3, that is, the pixel electrode of the organic light emitting diode OLED, may be initialized to the initialization voltage Vint by the turned-on fourth transistor T4. Because the pixel electrode of the organic light emitting diode OLED is reset to the initialization voltage Vint in the first period P1, the first period P1 may be referred to as a reset period.

The second period P2 may be a compensation period for compensating for the threshold voltage of the first transistor T1. In the second period P2, the third gate signal GR with a gate-on voltage may be supplied to the third gate line GRL, and the fourth gate signal EM with a gate-on voltage may be supplied to the fourth gate line EML. The first gate signal GW, the second gate signal GI, and the fifth gate signal EMB may be supplied with a gate-off voltage during the second period P2.

The third transistor T3 may be turned on by the third gate signal GR, and the fifth transistor T5 may be turned on by the fourth gate signal EM. Accordingly, the reference voltage Vref may be supplied to the first node N1 and the first driving voltage ELVDD may be supplied to the first terminal of the first transistor T1 and thus the first transistor T1 may be turned on. When the voltage of the second terminal of the first transistor T1 reaches the difference (Vref-Vth) between the reference voltage Vref and the threshold voltage (Vth) of the first transistor T1, the first transistor T1 may be turned off. A voltage corresponding to the threshold voltage (Vth) of the first transistor T1 may be stored in the first capacitor C1 to compensate for the threshold voltage (Vth) of the first transistor T1.

The third period P3 may be a write period in which the data signal is supplied to the pixel. In the third period P3, the first gate signal GW with a gate-on voltage may be supplied to the first gate line GWL. The second gate signal GI, third gate signal GR, the fourth gate signal EM, and the fifth gate signal EMB may be supplied with a gate-off voltage during the third period P3.

The second transistor T2 may be turned on by the first gate signal GW, and the turned-on second transistor T2 may be configured to transmit the data signal DATA from the data line DL to the first node N1, that is, the first gate of the first transistor T1. Accordingly, the voltage of the first node N1 may be changed from the reference voltage Vref to a voltage corresponding to the data signal DATA. In this case, the voltage of the second node N2 may also be changed corresponding to the amount of change in the voltage of the first node N1. The voltage of the second node N2 may be the voltage $(Vref-Vth+\alpha\times(DATA-Vref))$ changed according to the capacitance ratio $(\alpha=C1/(C1+C2))$ of the first capacitor C1 and the second capacitor C2. Accordingly, the first capacitor C1 may be charged with a voltage corresponding to the data signal DATA and the threshold voltage Vth of the first transistor T1.

The fourth period P4 may be a second initialization period for initializing the third node N3 to which the pixel electrode of the organic light emitting diode OLED is connected, before the emission period EP after data writing. The second gate signal GI with a gate-on voltage may be supplied to the second gate line GIL. The first gate signal GW, third gate signal GR, the fourth gate signal EM, and the fifth gate signal EMB may be supplied with a gate-off voltage during the fourth period P4.

The fourth transistor T4 may be turned on by the second gate signal GI, and the initialization voltage Vint may be transmitted to the pixel electrode of the organic light emitting diode OLED by the turned-on fourth transistor T4. In an embodiment, the fourth period P4 is omitted.

The emission period EP may be a period in which the organic light emitting diode OLED emits light. In the emission period EP, the fourth gate signal EM with a gate-on voltage may be supplied to the fourth gate line EML, and the fifth gate signal EMB with a gate-on voltage may be supplied to the fifth gate line EMBL. The first gate signal GW, the second gate signal GI, and the third gate signal GR may be a gate-off voltage during the emission period EP.

The fifth transistor T5 may be turned on by the fourth gate signal EM, and the driving voltage ELVDD may be supplied to the first terminal of the first transistor T1 by the turned-on fifth transistor T5. The first transistor T1 may output a voltage corresponding to the data signal DATA stored in the first capacitor C1, that is, a driving current ($Id \propto (Vgs-Vth)^2$) corresponding to the voltage (Vgs−Vth) obtained by subtracting the threshold voltage (Vth) of the first transistor T1 from the gate-source voltage (Vgs) of the first transistor T1. The driving current may flow through the organic light emitting diode OLED through the sixth transistor T6 turned on by the fifth gate signal EMB, and the organic light emitting diode OLED may emit light with a brightness corresponding to the driving current.

In another embodiment, as illustrated in FIG. 4B, the fifth gate signal EMB with a gate-on voltage may be applied to the fifth gate line EMBL in at least a portion of the first period P1 and the fourth period P4. Accordingly, in the first period P1 and the fourth period P4, the fourth transistor T4 and the sixth transistor T6 may be turned on, and the second node N2 and the third node N3 may be initialized to the initialization voltage Vint.

Figure 5:
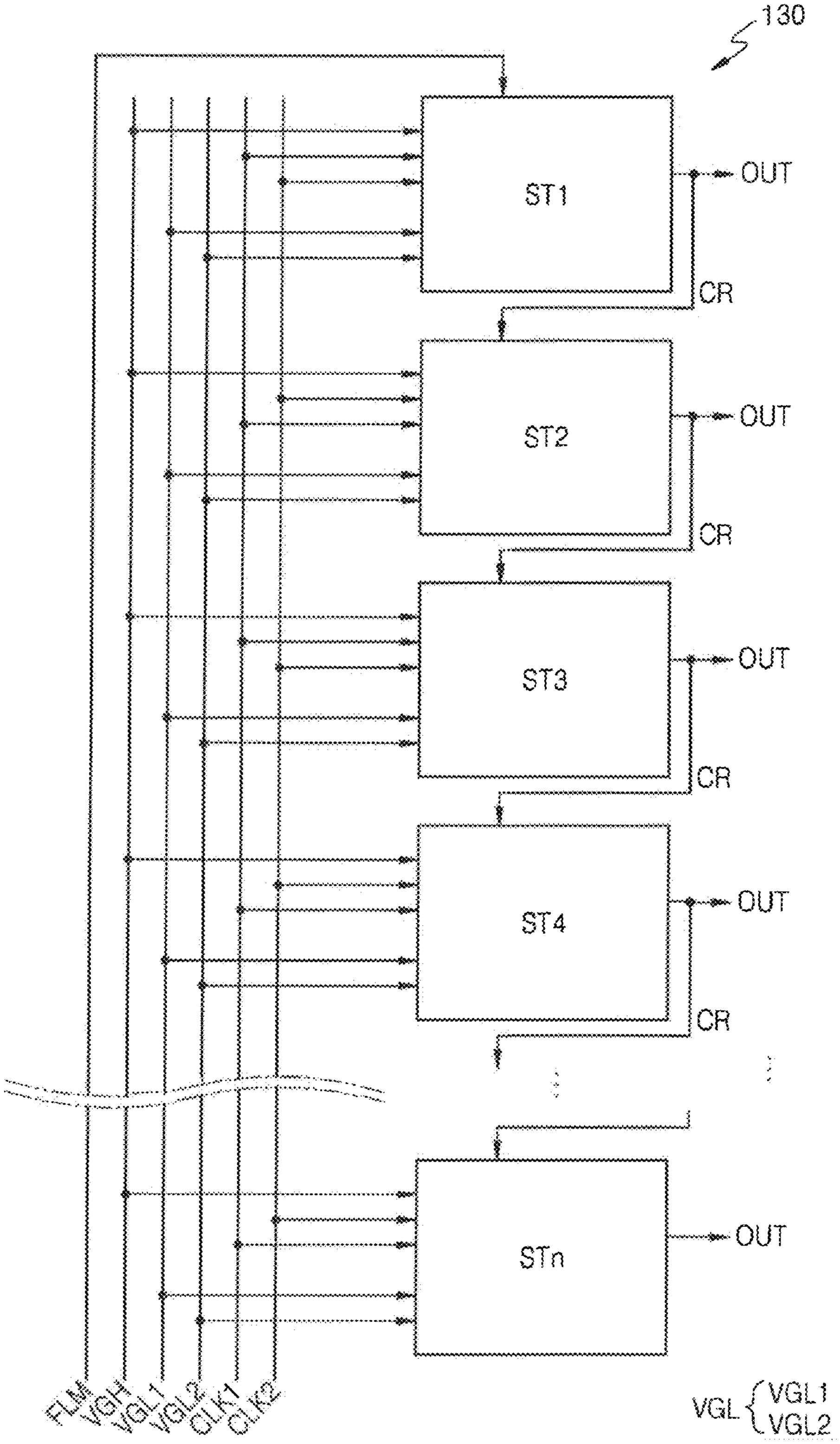
FIGS. 5 and 6 are diagrams schematically illustrating a gate driving circuit of FIG. 2.
Figure 6:
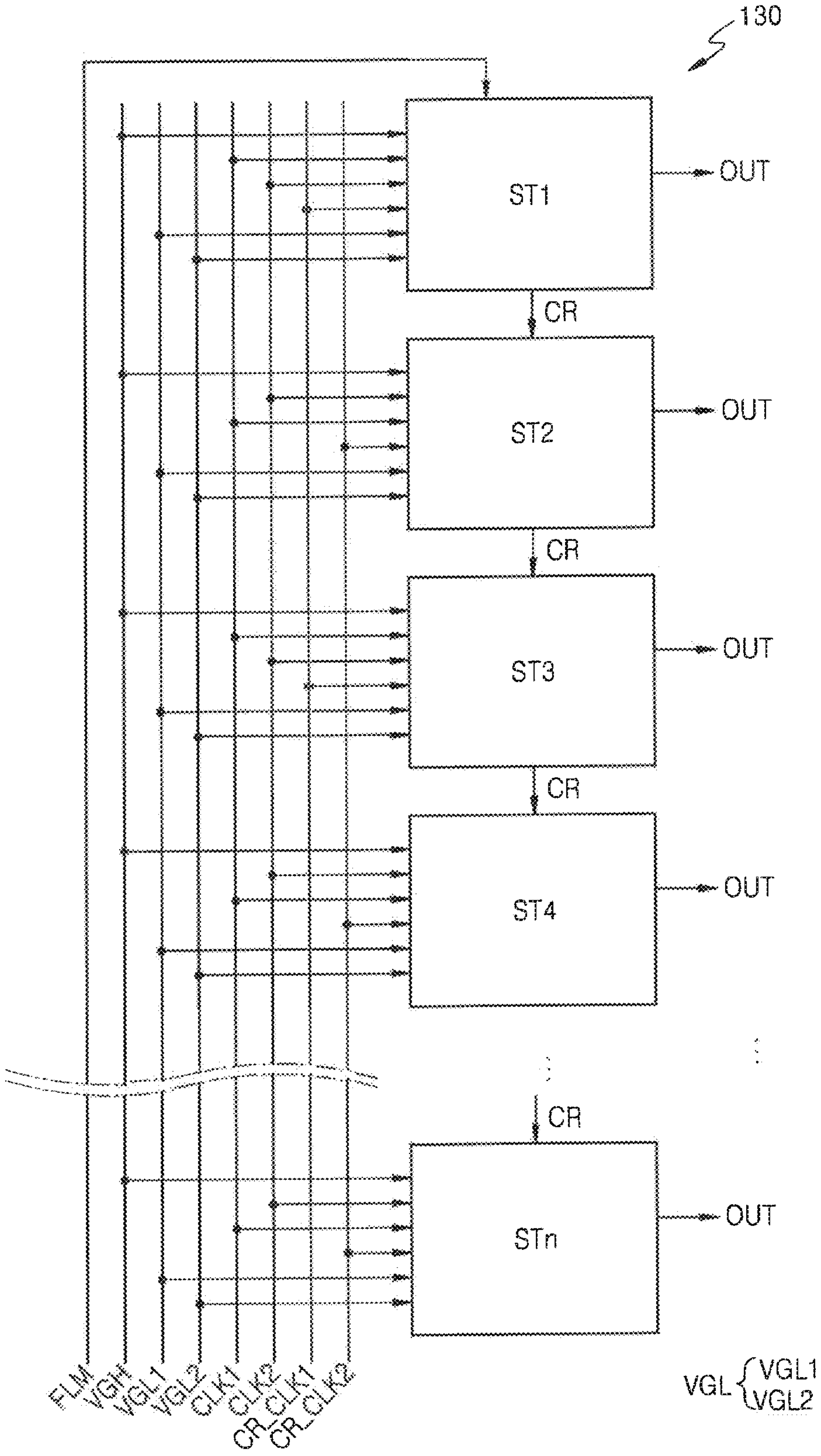

FIGS. 5 and 6 are diagrams schematically illustrating a gate driving circuit of FIG. 2 according to an embodiment.

Referring to FIG. 5, the gate driving circuit 130 may include a plurality of stages ST1 to STn. The plurality of stages ST1 to STn may sequentially output an output signal OUT. The output signal OUT may be a gate signal. The number of stages present in the gate driving circuit DRV may vary depending on the number of rows provided in the pixel area 110. In an embodiment, the number of stages may be equal to the number of rows or may be less than the number of rows.

Each of the stages ST1 to STn may be connected to the gate line of at least one row corresponding thereto. Each of the stages ST1 to STn may receive at least one clock signal and at least one voltage signal and may supply the output signal OUT to at least one gate line GL. In an embodiment, each of the stages ST1 to STn may supply the output signal OUT to one gate line GL included in one row corresponding thereto. In another embodiment, each of the stages ST1 to STn may supply the output signal OUT to two gate lines GL included in two rows corresponding thereto.

Each of the plurality of stages ST1 to STn may output the output signal OUT in response to a start signal. A start signal FLM for controlling the timing of a first output signal OUT may be supplied to the first stage ST1. A carry signal CR may be supplied as a start signal to each of the second to n-th stages ST2 to STn. In an embodiment, the carry signal CR is the output signal OUT output from a previous stage. The previous stage may be a stage located previous to another stage. FIG. 5 illustrates an example in which the previous stage is an immediately previous stage. For example, a third output signal OUT output from the third stage ST3 (previous stage) may be input as a carry signal CR to the fourth stage ST4 (present stage). In another embodiment, as illustrated in FIG. 6, the carry signal CR may be a signal generated and output separately from the output signal OUT output from the previous stage.

A first voltage VGH, a second voltage VGL1, and a third voltage VGL2 may be input to each of the stages ST1 to STn. The first voltage VGH may be a first-level voltage, and the second voltage VGL1 and the third voltage VGL2 may be a second-level voltage. In an embodiment, the second voltage VGL1 has a lower voltage level than the first voltage VGH, and the third voltage VGL2 has a lower voltage level than the second voltage VGL1.

A first clock signal CLK1 and a second clock signal CLK2 may be input to each of the stages ST1 to STn. As illustrated in FIG. 6, when the carry signal CR is a signal generated and output separately from the output signal OUT from the previous stage, a first carry clock signal CR_CLK1 or a second carry clock signal CR_CLK2 may be further input to each of the stages ST1 to STn.

Figure 7:
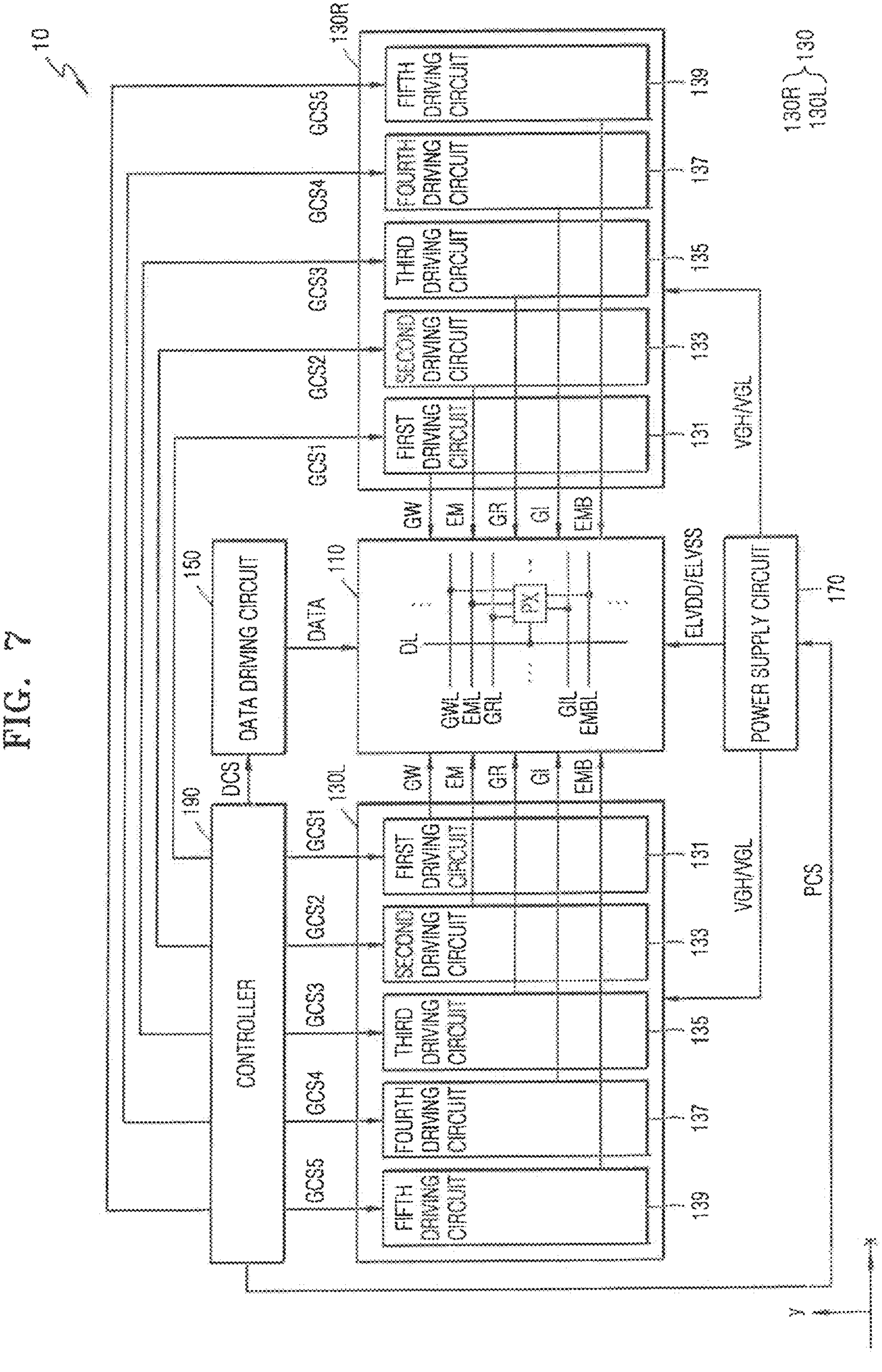
FIG. 7 is a diagram schematically illustrating a display apparatus according to an embodiment.
Figure 8:
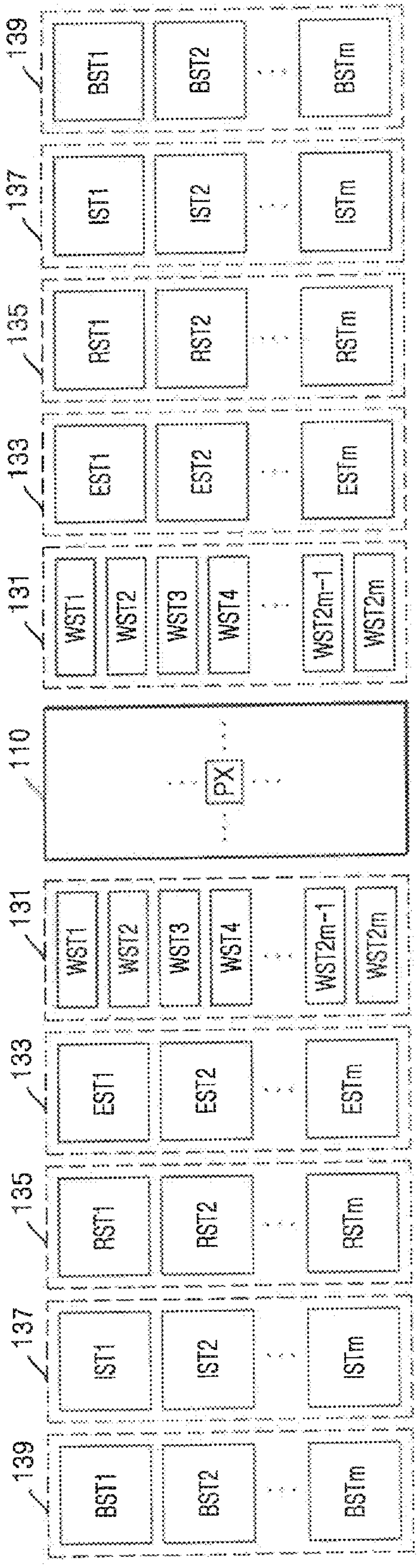
FIG. 8 is a diagram schematically illustrating a gate driving circuit of FIG. 7.
Figure 9:
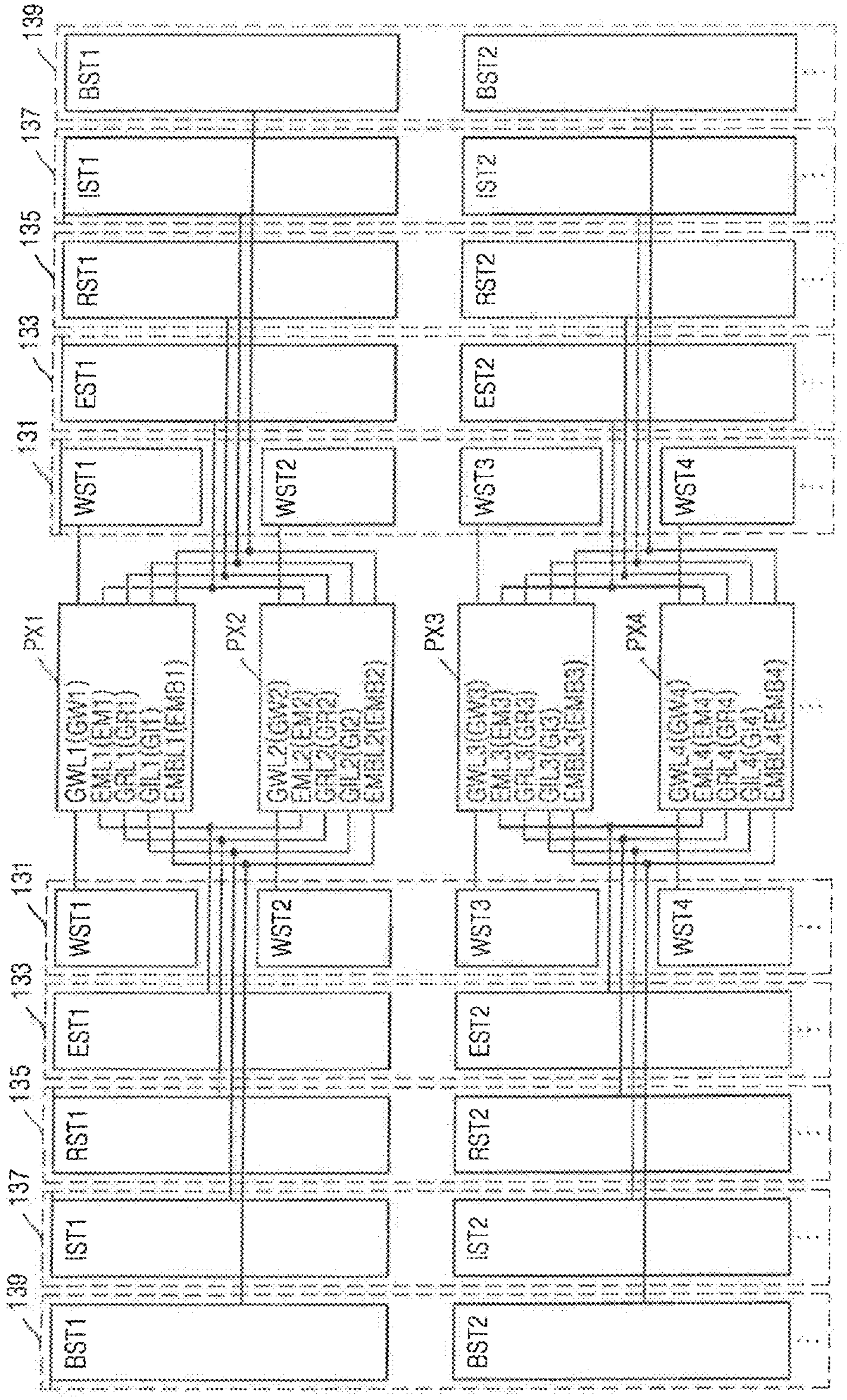
FIG. 9 is a diagram schematically illustrating a portion of a pixel and the gate driving circuit of FIG. 7.
Figure 10A:
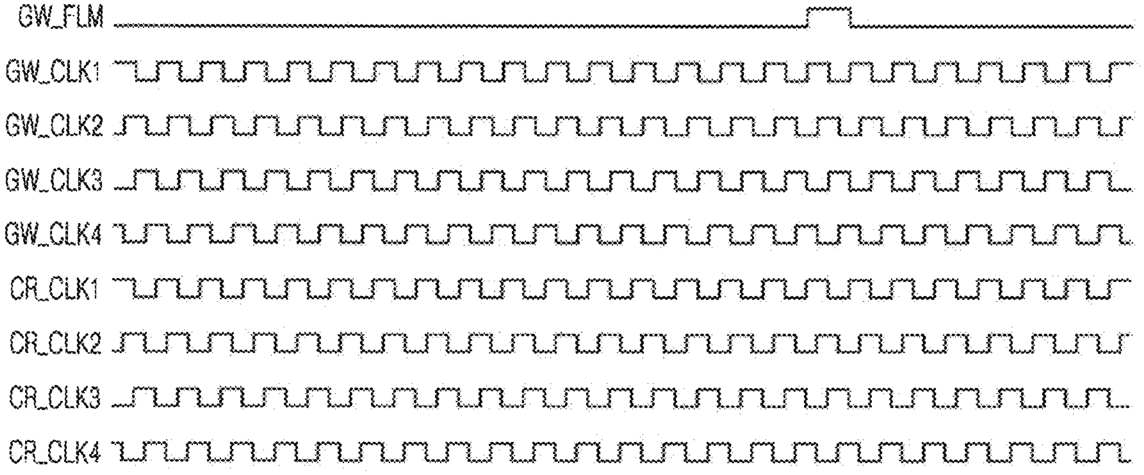
FIGS. 10A to 10E are diagrams illustrating start signals and clock signals input to the gate driving circuit of FIG. 7.
Figure 10B:
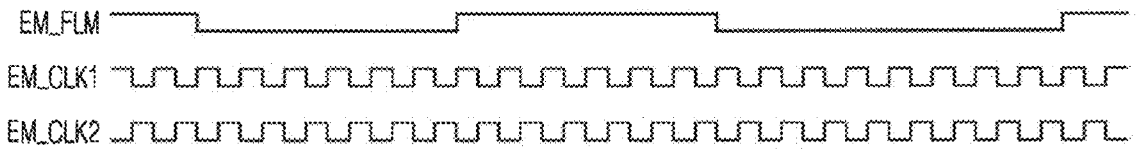
Figure 10C:
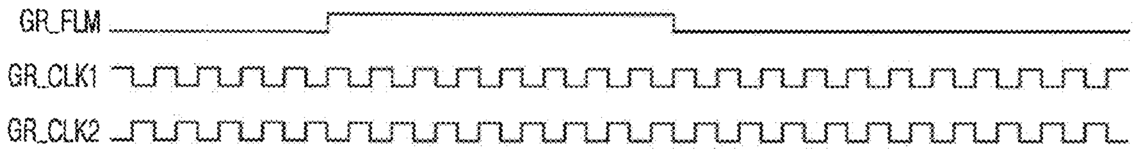
Figure 10D:
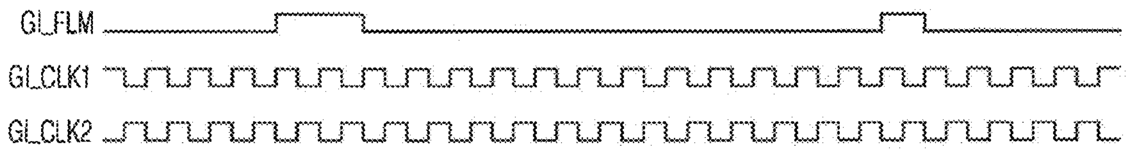
Figure 10E:
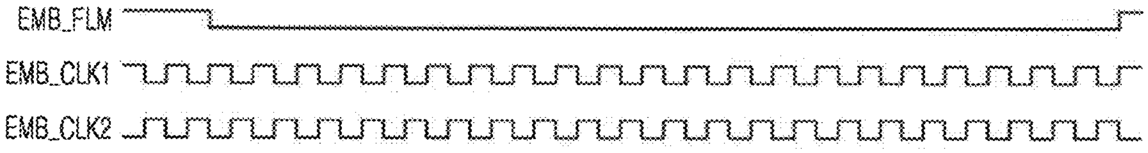
Figure 11:
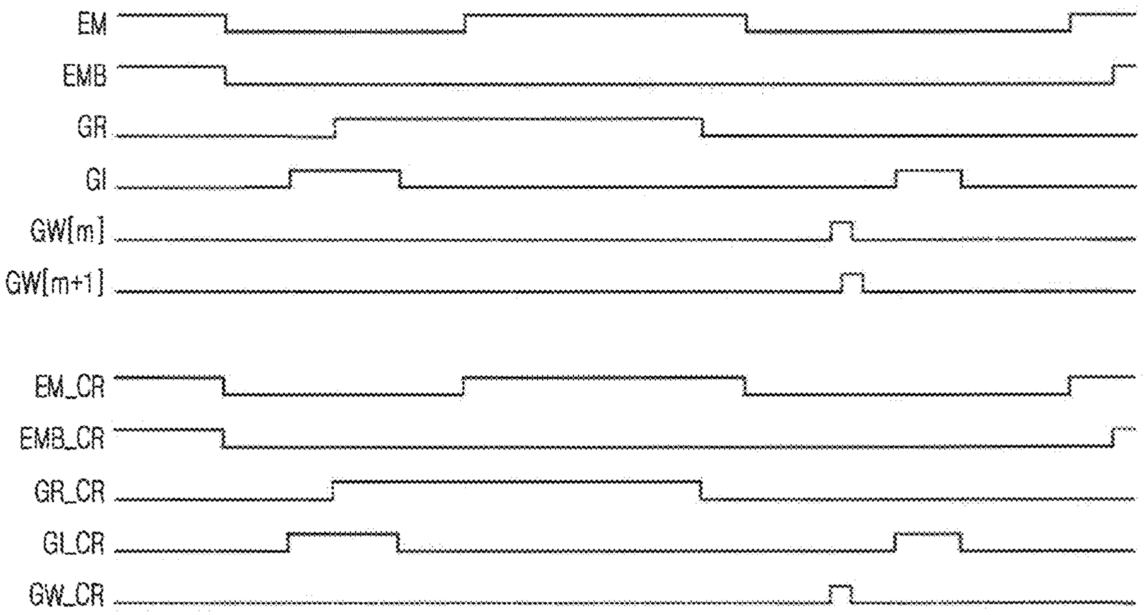
FIG. 11 is a diagram illustrating gate signals and carry signals output from the gate driving circuit of FIG. 7.

FIG. 7 is a diagram schematically illustrating a display apparatus according to an embodiment. FIG. 8 is a diagram schematically illustrating a gate driving circuit of FIG. 7. FIG. 9 is a diagram schematically illustrating a portion of a pixel and the gate driving circuit of FIG. 7. FIGS. 10A to 10E are diagrams illustrating start signals and clock signals input to the gate driving circuit of FIG. 7. FIG. 11 is a diagram illustrating gate signals and carry signals output from the gate driving circuit of FIG. 7. FIG. 11 illustrates gate signals supplied to an m-th row and an (m+1)th row.

As illustrated in FIG. 7, a display apparatus 10 may include a pixel area 110 (e.g., display panel), a gate driving circuit 130, a data driving circuit 150, a power supply circuit 170, and a controller 190. Hereinafter, descriptions redundant with those given above with reference to FIGS. 1A, 1B, and 2 will be omitted for conciseness.

In the pixel area 110, a plurality of gate lines may be arranged at certain intervals in the y direction (e.g., the column direction). The gate lines may extend in the x direction (e.g., the row direction) to be connected to the pixels PX located in the same row (row line). For example, the pixel PX may be the pixel illustrated in FIG. 3, and the gate lines connected to the pixels PX may include first gate lines GWL, second gate lines GIL, third gate lines GRL, fourth gate lines EML, and fifth gate lines EMBL. The first gate lines GWL, the second gate lines GIL, the third gate lines GRL, the fourth gate lines EML, and the fifth gate lines EMBL may be arranged in each row.

In the pixel area 110, a plurality of data lines may be arranged at certain intervals in the x direction. The data lines may extend in the y direction to be connected to the pixels PX located in the same column (column line).

The gate driving circuit 130 may be connected to the gate lines and may sequentially apply gate signals to the gate lines. The gate driving circuit 130 may include a first gate driving circuit 130L arranged on the left side of the pixel area 110 and a second gate driving circuit 130R arranged on the right side of the pixel area 110. In other embodiments, the gate driving circuit 130 may include only a gate driving circuit 130L arranged on the left side of the pixel area 110 or a second gate driving circuit 130R arranged on the right side of the pixel area 110. Each of the first gate driving circuit 130L and the second gate driving circuit 130R may include a first driving circuit 131, a second driving circuit 133, a third driving circuit 135, a fourth driving circuit 137, and a fifth driving circuit 139.

The first driving circuit 131 may be connected to a plurality of first gate lines GWL and may sequentially supply first gate signals GW to the first gate lines GWL according to or in response to a first control signal GCS1. The second driving circuit 133 may be connected to a plurality of fourth gate lines EML and may sequentially supply fourth gate signals EM to the fourth gate lines EML according to or in response to a second control signal GCS2. The third driving circuit 135 may be connected to a plurality of third gate lines GRL and may sequentially supply third gate signals GR to the third gate lines GRL according to or in response to a third control signal GCS3. The fourth driving circuit 137 may be connected to a plurality of second gate lines GIL and may sequentially supply second gate signals GI to the second gate lines GIL according to or in response to a fourth control signal GCS4. The fifth driving circuit 139 may be connected to a plurality of fifth gate lines EMBL and may sequentially supply fifth gate signals EMB to the fifth gate lines EMBL according to or in response to a fifth control signal GCS5.

The data driving circuit 150 may be connected to a plurality of data lines DL and may apply data signals DATA representing gradation to the data lines DL according to a sixth control signal DCS.

The power supply circuit 170 may generate voltages for driving the pixel PX according to a seventh control signal PCS. For example, the power supply circuit 170 may generate a driving voltage ELVDD and a common voltage ELVSS and supply the same to the pixels PX. The power supply circuit 170 may generate a reference voltage Vref and an initialization voltage Vint and supply the same to the pixels PX. In an embodiment, the voltage level of the driving voltage ELVDD is higher than the voltage level of the common voltage ELVSS. In an embodiment, the voltage level of the reference voltage Vref is lower than the voltage level of the driving voltage ELVDD. In an embodiment, the voltage level of the initialization voltage Vint is lower than the voltage level of the common voltage ELVSS.

The power supply circuit 170 may generate voltages VGH and VGL for driving the gate driving circuit 130 and transmit the same to the gate driving circuit 130. The voltage VGL may include a second voltage VGL1 (see FIGS. 5 and 6) and a third voltage VGL2 (see FIGS. 5 and 6).

Referring to FIG. 8, each of the first driving circuit 131, the second driving circuit 133, the third driving circuit 135, the fourth driving circuit 137, and the fifth driving circuit 139 may include a plurality of stages. Each stage may receive at least one clock signal and at least one voltage signal and generate a gate signal corresponding thereto.

As illustrated in FIGS. 10A to 10E, at least one clock signal may be a square wave signal that repeats a high-level voltage (a first-level voltage) and a low-level voltage (a second-level voltage). The high-level voltage may be a gate-on voltage for turning on the N-type transistor, and the low-level voltage may be a gate-off voltage for turning off the N-type transistor. The timing at which a rising edge of a clock signal starts (hereinafter referred to as 'rising edge timing') may be determined based on a horizontal synchronization signal Hsync.

Under the control by the controller 190, the power supply circuit 170 may adjust the rising edge timing of the clock signals supplied to each of the first driving circuit 131, the second driving circuit 133, the third driving circuit 135, the fourth driving circuit 137, and the fifth driving circuit 139 and the timing at which a falling edge of a clock signal starts (hereinafter referred to as 'falling edge timing').

Each of the first driving circuit 131, the second driving circuit 133, the third driving circuit 135, the fourth driving circuit 137, and the fifth driving circuit 139 may output gate signals with a certain signal width at a certain timing according to the rising edge timing and the falling edge timing of the clock signals.

The clock signals supplied to each of the first driving circuit 131, the second driving circuit 133, the third driving circuit 135, the fourth driving circuit 137, and the fifth driving circuit 139 may be signals that have a same waveform but are phase-shifted (phase-delayed) at certain intervals. For example, as illustrated in FIG. 10D, a second gate clock signal GI_CLK2 has the same waveform as a second gate clock signal GI_CLK1 but is phase-shifted (phase-delayed) at certain intervals and then supplied to the fourth driving circuit 137.

As shown in FIG. 8, the first driving circuit 131 may include a plurality of stages WST1, WST2, WST3, WST4, . . . , WST2*m*-1, WST2*m* connected in cascade, and each of the plurality of stages WST1, WST2, WST3, WST4, . . . , WST2*m*-1, WST2*m* may correspond to each row of the pixel unit 110. Referring to FIGS. 10A and 11, the plurality of stages WST1, WST2, WST3, WST4, . . . , WST2*m*-1, WST2*m* may generate first gate signals GW, and carry signals GW_CR based on a first start signal GW_FLM, first gate clock signals GW_CLK1, GW_CLK2, GW_CLK3, and GW_CLK4, and carry clock signals CR_CLK1, CR_CLK2, CR_CLK3, and CR_CLK4. The first gate signal GW may be output to the first gate line GWL of a corresponding row, and the carry signal GW_CR may be output to a next stage.

Odd-numbered stages among the plurality of stages WST1, WST2, WST3, WST4, . . . , WST2*m*-1, WST2*m* may output a first gate signal GW with a first-level voltage at a certain timing in synchronization with the rising edge of the first gate clock signal GW_CLK1 or the first gate clock signal GW_CLK3 among the first gate clock signals GW_CLK1, GW_CLK2, GW_CLK3, and GW_CLK4. The first gate clock signal GW_CLK1 and the first gate clock signal GW_CLK3 may be alternately input to the odd-numbered stages. Even-numbered stages among the plurality of stages WST1, WST2, WST3, WST4, . . . , WST2*m*-1, WST2*m* may output a first gate signal GW with a first-level voltage at a certain timing in synchronization with the rising edge of the first gate clock signal GW_CLK2 or the first gate clock signal GW_CLK4 among the first gate clock signals GW_CLK1, GW_CLK2, GW_CLK3, and GW_CLK4. The first gate clock signal GW_CLK2 and the first gate clock signal GW_CLK4 may be alternately input to the even-numbered stages.

The first gate signals GW output from the plurality of stages WST1, WST2, WST3, WST4, . . . , WST2*m*-1, WST2*m* may be sequentially shifted. For example, the first gate signals GW may be shifted at intervals of 1 horizontal period (H) and sequentially output. Here, 1H may be 1/(driving frequency×vertical resolution). The number of stages of the first driving circuit 131 may be equal to the number of rows or the number of first gate lines GWL.

Referring to FIG. 8, the second driving circuit 133 may include a plurality of stages EST1, EST2, . . . , ESTm connected in cascade, and each of the plurality of stages EST1, EST2, . . . , ESTm may correspond to two rows (a pair of rows) of the pixel area 110. Referring to FIGS. 10B and 11, the plurality of stages EST1, EST2, . . . , ESTm may generate fourth gate signals EM based on a fourth start signal EM_FLM and fourth gate clock signals EM_CLK1 and EM_CLK2. In an embodiment, the fourth gate signal EM is simultaneously output to the fourth gate lines EML arranged in two rows and may be output as a carry signal EM_CR to a next stage.

Odd-numbered stages among the plurality of stages EST1, EST2, . . . , ESTm may output a fourth gate signal EM with a first-level voltage at a certain timing in synchronization with the rising edge of one of the fourth gate clock signals EM_CLK1 and EM_CLK2 (e.g., the fourth gate clock signal EM_CLK1). Even-numbered stages among the plurality of stages EST1, EST2, . . . , ESTm may output a fourth gate signal EM with a first-level voltage at a certain timing in synchronization with the rising edge of another of the fourth gate clock signals EM_CLK1 and EM_CLK2 (e.g., the fourth gate clock signal EM_CLK2).

The fourth gate signals EM output from the plurality of stages EST1, EST2, . . . , ESTm may be sequentially shifted. For example, the fourth gate signals EM may be shifted at intervals of 2 horizontal periods (H) and sequentially output. The number of stages EST of the second driving circuit 133 may be ½ of the number of rows or ½ of the number of fourth gate lines EML.

As shown in FIG. 8, the third driving circuit 135 may include a plurality of stages RST1, RST2, . . . , RSTm connected in cascade, and each of the plurality of stages RST1, RST2, . . . , RSTm may correspond to two rows (a pair of rows) of the pixel area 110. Referring to FIGS. 10C and 11, the plurality of stages RST1, RST2, . . . , RSTm may generate third gate signals GR based on a third start signal GR_FLM and third gate clock signals GR_CLK1 and GR_CLK2. In an embodiment, the third gate signal GR is simultaneously output to the third gate lines GRL arranged in two rows and may be output as a carry signal GR_CR to a next stage.

Odd-numbered stages among the plurality of stages RST1, RST2, . . . , RSTm may output a third gate signal GR with a first-level voltage at a certain timing in synchronization with the rising edge of one of the third gate clock signals GR_CLK1 and GR_CLK2 (e.g., the third gate clock signal GR_CLK1). Even-numbered stages among the plurality of stages RST1, RST2, . . . , RSTm may output a third gate signal GR with a first-level voltage at a certain timing in synchronization with the rising edge of another of the third gate clock signals GR_CLK1 and GR_CLK2 (e.g., the third gate clock signal GR_CLK2).

The third gate signals GR output from the plurality of stages RST1, RST2, . . . , RSTm may be sequentially shifted. For example, the third gate signals GR may be shifted at intervals of 2 horizontal periods (H) and sequentially output. The number of stages RST of the third driving circuit 135 may be ½ of the number of rows or ½ of the number of third gate lines GRL.

As shown in FIG. 8, the fourth driving circuit 137 may include a plurality of stages IST1, IST2, . . . , ISTm connected in cascade, and each of the plurality of stages IST1, IST2, . . . , ISTm may correspond to two rows (a pair of rows) of the pixel area 110. Referring to FIGS. 10D and 11, the plurality of stages IST1, IST2, . . . , ISTm may generate second gate signals GI based on a second start signal GI_FLM and second gate clock signals GI_CLK1 and GI_CLK2. In an embodiment, the second gate signal GI is simultaneously output to the second gate lines GIL arranged in two rows and may be output as a carry signal GI_CR to a next stage.

Odd-numbered stages among the plurality of stages IST1, IST2, . . . , ISTm may output a second gate signal GI with a first-level voltage at a certain timing in synchronization with the rising edge of one of the second gate clock signals GI_CLK1 and GI_CLK2 (e.g., the second gate clock signal GI_CLK1). Even-numbered stages among the plurality of stages IST1, IST2, . . . , ISTm may output a second gate signal GI with a first-level voltage at a certain timing in synchronization with the rising edge of another of the second gate clock signals GI_CLK1 and GI_CLK2 (e.g., the second gate clock signal GI_CLK2).

The second gate signals GI output from the plurality of stages IST1, IST2, . . . , ISTm may be sequentially shifted. For example, the second gate signals GI may be shifted at intervals of 2 horizontal periods (H) and sequentially output. The number of stages IST of the fourth driving circuit 137 may be ½ of the number of rows or ½ of the number of second gate lines GIL.

As shown in FIG. 8, the fifth driving circuit 139 may include a plurality of stages BST1, BST2, . . . , BSTm connected in cascade, and each of the plurality of stages BST1, BST2, . . . , BSTm may correspond to two rows (a pair of rows) of the pixel area 110. Referring to FIGS. 10E and 11, the plurality of stages BST1, BST2, . . . , BSTm may generate fifth gate signals EMB based on a fifth start signal EMB_FLM and fifth gate clock signals EMB_CLK1 and EMB_CLK2. The fifth gate signal EMB may be simultaneously output to the fifth gate lines EMBL arranged in two rows and may be output as a carry signal EMB_CR to a next stage.

Odd-numbered stages among the plurality of stages BST1, BST2, . . . , BSTm may output a fifth gate signal EMB with a first-level voltage at a certain timing in synchronization with the rising edge of one of the fifth gate clock signals EMB_CLK1 and EMB_CLK2 (e.g., the fifth gate clock signal EMB_CLK1). Even-numbered stages among the plurality of stages BST1, BST2, . . . , BSTm may output a fifth gate signal EMB with a first-level voltage at a certain timing in synchronization with the rising edge of another of the fifth gate clock signals EMB_CLK1 and EMB_CLK2 (e.g., the fifth gate clock signal EMB_CLK2).

The fifth gate signals EMB output from the plurality of stages BST1, BST2, . . . , BSTm may be sequentially shifted. For example, the fifth gate signals EMB may be shifted at intervals of 2 horizontal periods (H) and sequentially output. The number of stages BST of the fifth driving circuit 139 may be ½ of the number of rows or ½ of the number of fifth gate lines EMBL.

As illustrated in FIG. 9, a first stage WST1 of the first driving circuit 131 may output a first first gate signal GW1 to a first gate line GWL1 connected to a first pixel PX1 arranged in a first row, a second stage WST2 of the first driving circuit 131 may output a second first gate signal GW2 to a first gate line GWL2 connected to a second pixel PX2 arranged in a second row, a third stage WST3 of the first driving circuit 131 may output a third first gate signal GW3 to a first gate line GWL3 connected to a third pixel PX3 arranged in a third row, and a fourth stage WST4 of the first driving circuit 131 may output a fourth first gate signal GW4 to a first gate line GWL4 connected to a fourth pixel PX4 arranged in a fourth row.

In an embodiment, a fourth gate signal EM output from a first stage EST1 of the second driving circuit 133 is simultaneously supplied as a first fourth gate signal EM1 to a fourth gate line EML1 connected to the first pixel PX1 and as a second fourth gate signal EM2 to a fourth gate line EML2 connected to the second pixel PX2. In an embodiment, a fourth gate signal EM output from a second stage EST2 of the second driving circuit 133 is simultaneously supplied as a third fourth gate signal EM3 to a fourth gate line EML3 connected to a third pixel PX3 arranged in a third row and as a fourth fourth gate signal EM4 to a fourth gate line EML4 connected to a fourth pixel PX4 arranged in a fourth row.

In an embodiment, a third gate signal GR output from a first stage RST1 of the third driving circuit 135 is simultaneously supplied as a first third gate signal GR1 to a third gate line GRL1 connected to the first pixel PX1 and as a second third gate signal GR2 to a third gate line GRL2 connected to the second pixel PX2. In an embodiment, a third gate signal GR output from a second stage RST2 of the third driving circuit 135 is simultaneously supplied as a third third gate signal GR3 to a third gate line GRL3 connected to the third pixel PX3 and as a fourth third gate signal GR4 to a third gate line GRL4 connected to the fourth pixel PX4.

In an embodiment, a second gate signal GI output from a first stage IST1 of the fourth driving circuit 137 is simultaneously supplied as a first second gate signal GI1 to a second gate line GIL1 connected to the first pixel PX1 and as a second second gate signal GI2 to a second gate line GIL2 connected to the second pixel PX2. In an embodiment, a second gate signal GI output from a second stage IST2 of the fourth driving circuit 137 is simultaneously supplied as a third second gate signal GI3 to a second gate line GIL3 connected to the third pixel PX3 and as a fourth second gate signal GI4 to a second gate line GIL4 connected to the fourth pixel PX4.

In an embodiment, a fifth gate signal EMB output from a first stage BST1 of the fifth driving circuit 139 is simultaneously supplied as a first fifth gate signal EMB1 to a fifth gate line EMBL1 connected to the first pixel PX1 and as a second fifth gate signal EMB2 to a fifth gate line EMBL2 connected to the second pixel PX2. In an embodiment, a fifth gate signal EMB output from a second stage BST2 of the fifth driving circuit 139 is simultaneously supplied as a third fifth gate signal EMB3 to a fifth gate line EMBL3 connected to the third pixel PX3 and as a fourth fifth gate signal EMB4 to a fifth gate line EMBL4 connected to the fourth pixel PX4.

In this way, as illustrated in FIG. 11, each of the second gate signal GI, the third gate signal GR, the fourth gate signal EM, and the fifth gate signal EMB may be equally supplied to an m-th pixel arranged in the m-th row and an (m+1)th pixel arranged in the (m+1)th row, and a first gate signal GW[m] and a first gate signal GW[m+1] may be sequentially supplied to the m-th pixel and the (m+1)th pixel.

Figure 12:
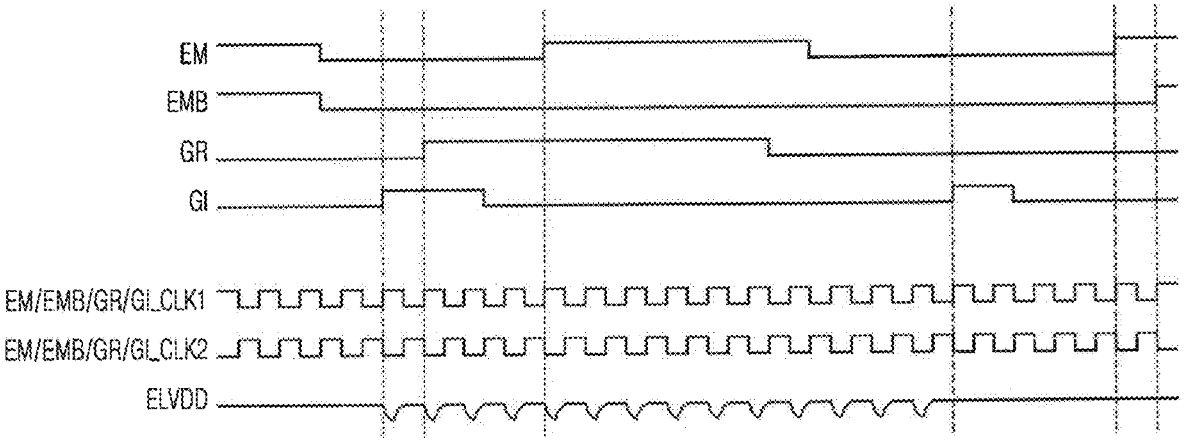
FIGS. 12 and 13 are diagrams schematically illustrating clock signals, gate signals, and change in a driving voltage ELVDD.
Figure 13:
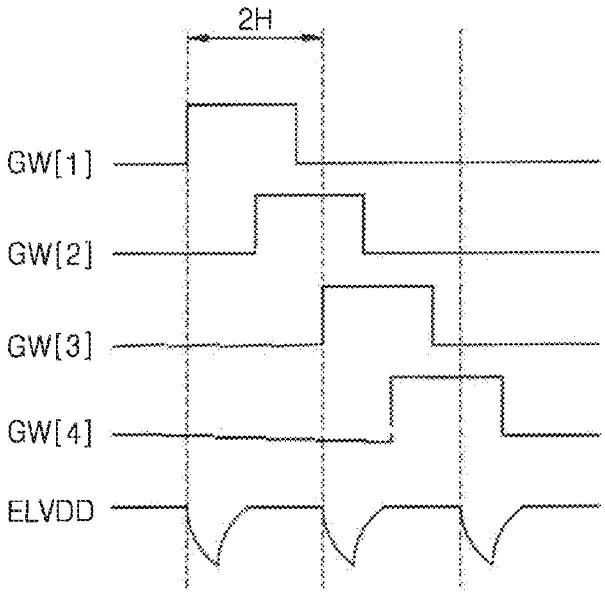
Figure 14:
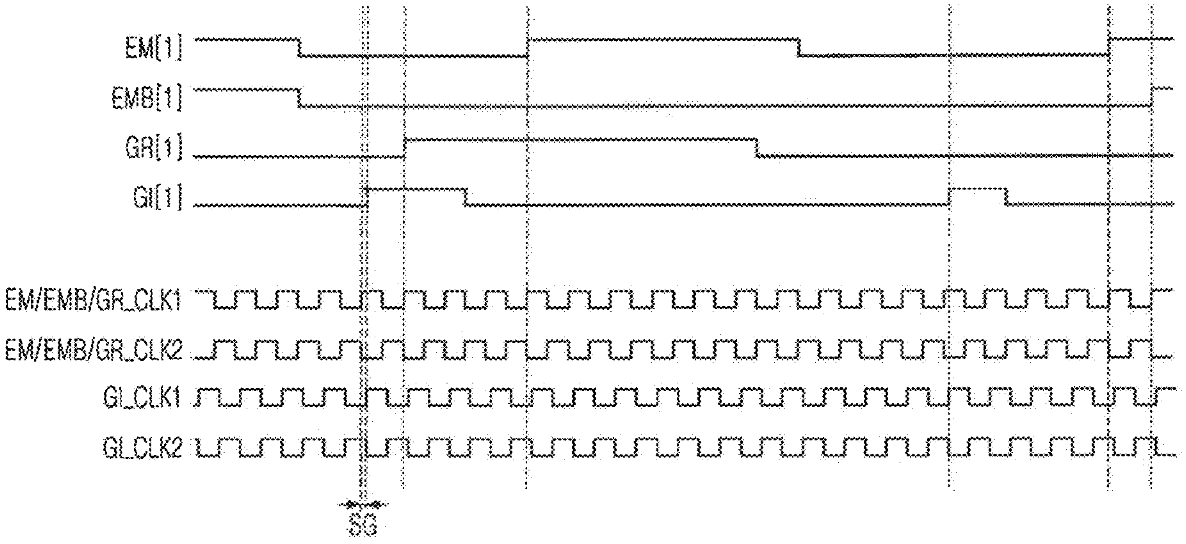
FIG. 14 is a diagram illustrating clock signals according to an embodiment.
Figure 15:
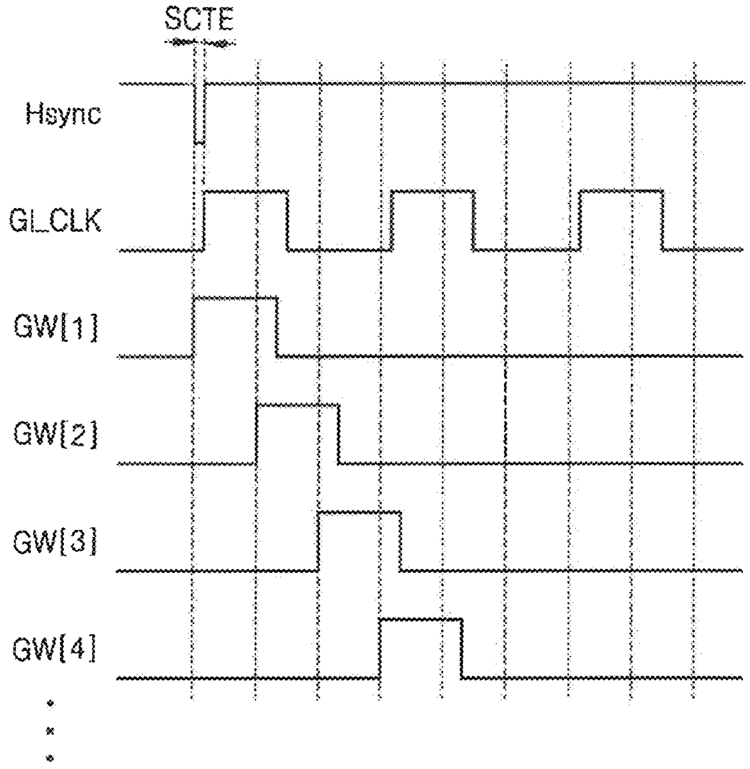
FIGS. 15 to 17 are diagrams illustrating clock signals and first gate signals according to an embodiment.
Figure 16:
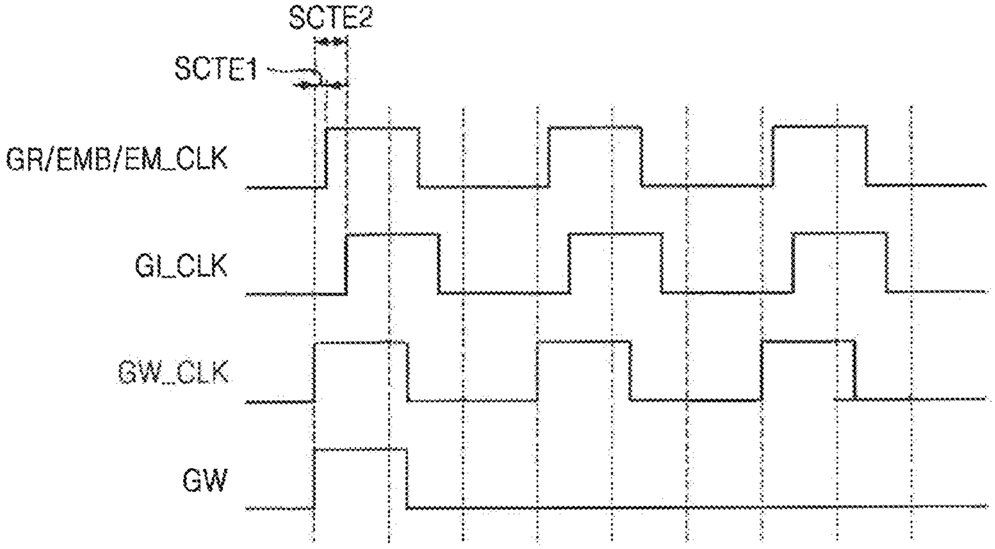
Figure 17:
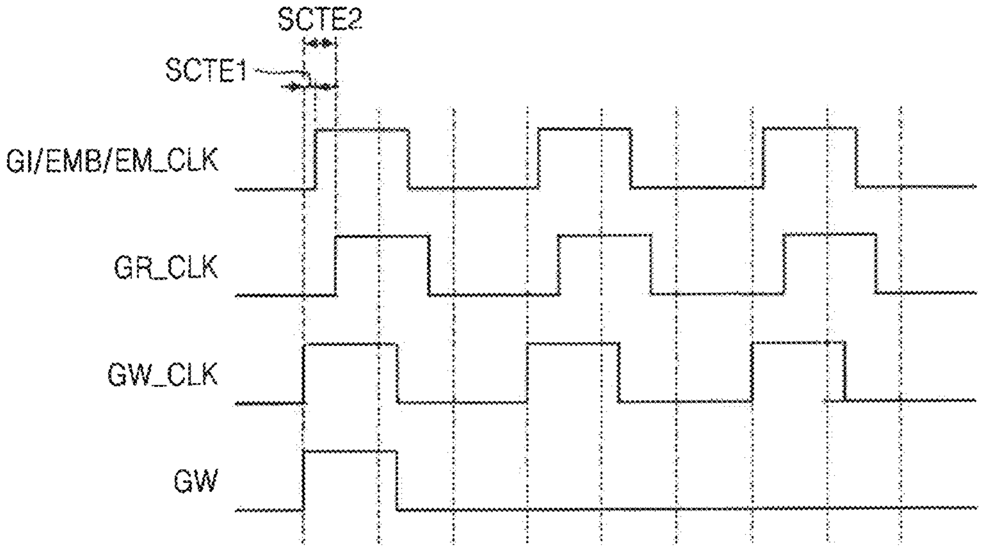

FIGS. 12 and 13 are diagrams schematically illustrating changes in clock signals, gate signals, and a driving voltage ELVDD. FIG. 14 is a diagram illustrating clock signals according to an embodiment. FIGS. 15 to 17 are diagrams illustrating clock signals and first gate signals according to an embodiment.

Referring to FIG. 12, in an embodiment, the rising edge timing of the second gate clock signal GI_CLK1, the rising edge timing of the third gate clock signal GR_CLK1, the rising edge timing of the fourth gate clock signal EM_CLK1, and the rising edge timing of the fifth gate clock signal EMB_CLK1 are equal to each other.

The second driving circuit 133, the third driving circuit 135, the fourth driving circuit 137, and the fifth driving circuit 139 that are common to pixels in two rows (i.e., common to two stages) may output gate signals at intervals of 2H by operating as a shift register. Accordingly, in the third gate signal GR, the fourth gate signal EM, and the fifth gate signal EMB, a signal ripple may occur at intervals of 2H, and thus, a driving voltage (ELVDD) ripple may occur at intervals of 2H. Also, as illustrated in FIG. 4B, when the sixth transistor T6 and the fourth transistor T4 are turned on in the first period P1 in which the second gate signal GI and the fifth gate signal EMB are supplied to the pixel PX and thus the second terminal of the first transistor T1 and the pixel electrode are initialized, a large driving voltage (ELVDD) ripple may occur. Because the first gate signal GW is output at intervals of 1H, the degree of a driving voltage (ELVDD) ripple when the first gate signal GW is supplied to the pixel PX arranged in the odd-numbered row may be different from the degree of a driving voltage (ELVDD) ripple when the first gate signal GW is supplied to the pixel PX arranged in the even-numbered row, as illustrated in FIG. 13. Accordingly, in response to the same data signal, the luminance due to the emission of light from the pixels PX in the odd row may be different from the luminance due to the emission of light from the pixels PX in the even row.

In an embodiment, the luminance deviation between the odd row and the even row may be minimized by adjusting the generation time of the driving voltage (ELVDD) ripple by adjusting the rising edge timing of the gate clock signal. At least one rising edge timing among the rising edge timing of the second gate clock signals GI_CLK1 and GI_CLK2, the rising edge timing of the third gate clock signals GR_CLK1 and GR_CLK2, the rising edge timing of the fourth gate clock signals EM_CLK1 and EM_CLK2, and the rising edge timing of the fifth gate clock signals EMB_CLK1 and EMB_CLK2 may be shifted, e.g. different from each other. For example, the rising edge timing of the second clock signal GI_CLK may be different from the rising edge timing of the third clock signal GR_CLK. Accordingly, the luminance deviation between the luminance due to the pixels PX in the odd row and the luminance due to the pixels PX in the even row may be minimized by adjusting the generation time of the driving voltage (ELVDD) ripple.

For example, as illustrated in FIG. 14, the rising edges of the third gate clock signal GR_CLK1, the fourth gate clock signal EM_CLK1, and the fifth gate clock signal EMB_CLK1 may be equal to each other, and the rising edge of the second gate clock signal GI_CLK1 may be shifted by a certain time SG from the rising edges thereof, i.e., to have a different rising edge timing. The rising edge timing of the second gate clock signal GI_CLK1 may be later than the rising edge timing of the third gate clock signal GR_CLK1, the fourth gate clock signal EM_CLK1, and the fifth gate clock signal EMB_CLK1.

Referring to FIG. 14, the fourth driving circuit 137 may output a first second gate signal GI[1] with a first-level voltage synchronized with the rising edge timing of the second gate clock signal GI_CLK1. The third driving circuit 135 may output a first third gate signal GR[1] with a first-level voltage synchronized with the rising edge timing of the third gate clock signal GR_CLK1. The second driving circuit 133 may output a first fourth gate signal EM[1] with a first-level voltage synchronized with the rising edge timing of the fourth gate clock signal EM_CLK1. The fifth driving circuit 139 may output a first fifth gate signal EMB[1] with a first-level voltage synchronized with the rising edge timing of the fifth gate clock signal EMB_CLK1.

In an embodiment, the rising edge timing of the third gate clock signal GR_CLK1, the rising edge timing of the fourth gate clock signal EM_CLK1, and the rising edge timing of the fifth gate clock signal EMB_CLK1 are equal to each other. Likewise, the rising edge timing of the third gate clock signal GR_CLK2, the rising edge timing of the fourth gate clock signal EM_CLK2, and the rising edge timing of the fifth gate clock signal EMB_CLK2 may be equal to each other.

In an embodiment, the rising edge timing of the second gate clock signal GI_CLK1 is shifted by a certain time SG from the rising edge timing of the third gate clock signal GR_CLK1, the rising edge timing of the fourth gate clock signal EM_CLK1, and the rising edge timing of the fifth gate clock signal EMB_CLK1. Likewise, the rising edge timing of the second gate clock signal GI_CLK2 may be shifted by a certain time SG from the rising edge timing of the third gate clock signal GR_CLK2, the rising edge timing of the fourth gate clock signal EM_CLK2, and the rising edge timing of the fifth gate clock signal EMB_CLK2. Accordingly, the luminance deviation between the luminance due to the pixels PX in the odd row and the luminance due to the pixels PX in the even row may be minimized by adjusting the generation time of the driving voltage (ELVDD) ripple.

Table 1 below illustrates a luminance deviation between the odd row and the even row depending on the rising edge timing SCTE of the second gate clock signal GI_CLK (GI_CLK1 and GI_CLK2) from a horizontal synchronization signal Hsync, as illustrated in FIG. 15. The luminance deviation between the odd row and the even row may vary depending on the rising edge timing SCTE of the second gate clock signal GI_CLK1.

Referring to Table 1, when the rising edge timing SCTE of the second gate clock signal GI_CLK is 0.5 μs, the luminance deviation between the odd row and the even row may be 3.99%, when the rising edge timing SCTE of the second gate clock signal GI_CLK is 1.0 μs, the luminance deviation between the odd row and the even row may be 1.21%, and when the rising edge timing SCTE of the second gate clock signal GI_CLK is 1.5 μs, the luminance deviation between the odd row and the even row may be 0.38%. In this case, the rising edge timing of the third gate clock signal GR_CLK (GR_CLK1 and GR_CLK2), the rising edge timing of the fourth gate clock signal EM_CLK (EM_CLK1 and EM_CLK2), and the rising edge timing of the fifth gate clock signal EMB_CLK (EMB_CLK1 and EMB_CLK2) may be 0.5 μs, and the rising edge timing of the first gate clock signal GW_CLK (GW_CLK1, GW_CLK2, GW_CLK3, and GW_CLK4) may be 0 μs.

TABLE 1

| SCTE (μs) | Luminance deviation (%) |
|---|---|
| 0.5 | 3.99 |
| 1.0 | 1.21 |
| 1.5 | 0.38 |

In an embodiment, as illustrated in FIG. 16, the rising edge timing SCTE2 of the second gate clock signal GI_CLK may be later than the rising edge timing SCTE1 of each of the third gate clock signal GR_CLK, the fourth gate clock signal EM_CLK, and the fifth gate clock signal EMB_CLK. The rising edge timing of the first gate clock signal GW_CLK may precede the rising edge timing SCTE2 of the second gate clock signal GI_CLK and the rising edge timing SCTE1 of each of the third gate clock signal GR_CLK, the fourth gate clock signal EM_CLK, and the fifth gate clock signal EMB_CLK. For example, the rising edge timing of the first gate clock signal GW_CLK may be 0 μs, the rising edge timing SCTE1 of each of the third gate clock signal GR_CLK, the fourth gate clock signal EM_CLK, and the fifth gate clock signal EMB_CLK may be 0.5 μs (or more), and the rising edge timing SCTE2 of the second gate clock signal GI_CLK may be 1.5 μs (or more). Accordingly, the luminance deviation between the luminance due to the pixels PX in the odd row and the luminance due to the pixels PX in the even row may be minimized by adjusting the generation time of the driving voltage (ELVDD) ripple.

In an embodiment, as illustrated in FIG. 17, the rising edge timing SCTE2 of the third gate clock signal GR_CLK may be later than the rising edge timing SCTE1 of each of the second gate clock signal GI_CLK, the fourth gate clock signal EM_CLK, and the fifth gate clock signal EMB_CLK. The rising edge timing of the first gate clock signal GW_CLK may precede the rising edge timing SCTE2 of the third gate clock signal GR_CLK and the rising edge timing SCTE1 of each of the second gate clock signal GI_CLK, the fourth gate clock signal EM_CLK, and the fifth gate clock signal EMB_CLK. For example, the rising edge timing of the first gate clock signal GW_CLK may be 0 μs, the rising edge timing SCTE1 of each of the second gate clock signal GI_CLK, the fourth gate clock signal EM_CLK, and the fifth gate clock signal EMB_CLK may be 0.5 μs (or more), and the rising edge timing SCTE2 of the third gate clock signal GR_CLK may be 1.5 μs (or more). Accordingly, the luminance deviation between the luminance due to the pixels PX in the odd row and the luminance due to the pixels PX in the even row may be minimized by adjusting the generation time of the driving voltage (ELVDD) ripple.

However, embodiments of the disclosure are not limited to FIGS. 16 and 17. In an embodiment, the rising edge timing of the first gate clock signal GW_CLK may be 0 μs, the rising edge timing of each of the second gate clock signal GI_CLK, the third gate clock signal GR_CLK, and the fifth gate clock signal EMB_CLK may be 0.5 μs, and the rising edge timing of the fourth gate clock signal EM_CLK may be 1.5 μs. Alternatively, in an embodiment, the rising edge timing of the first gate clock signal GW_CLK may be 0 μs, the rising edge timing of each of the second gate clock signal GI_CLK, the third gate clock signal GR_CLK, and the fourth gate clock signal EM_CLK may be 0.5 μs, and the rising edge timing of the fifth gate clock signal EMB_CLK may be 1.5 μs.

Figure 18:
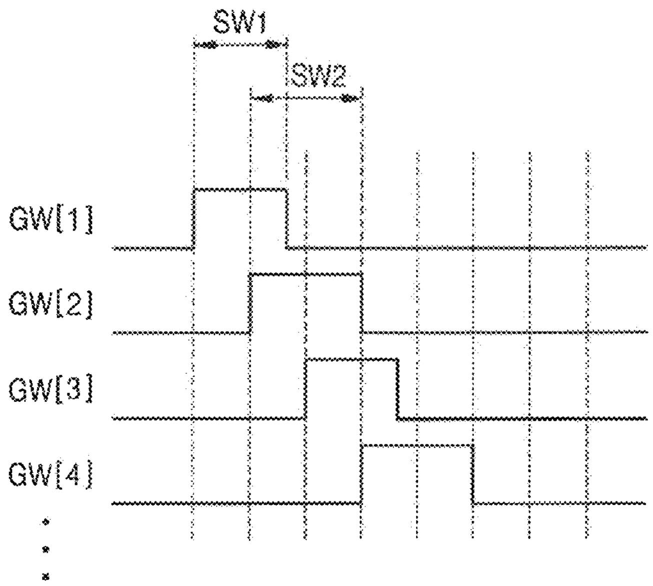
FIG. 18 is a diagram illustrating timing of a first gate signal according to an embodiment.

FIG. 18 is a diagram illustrating the timing of a first gate signal according to an embodiment.

In an embodiment, without changing the rising edge timing of the gate clock signal, by adjusting the signal width of the first gate signal, the luminance deviation between the luminance of the pixels PX in the odd row and the luminance of the pixels PX in the even row due to the ripple of the driving voltage ELVDD illustrated in FIGS. 12 and 13 may be minimized. The signal width of the first gate signal GW may correspond to the period (duration) in which the gate-on voltage of the first gate signal GW is maintained in the third period P3. The signal width of the first gate signal may be adjusted by adjusting the signal width of the first gate clock signal GW_CLK supplied to the first driving circuit 131. Under the control by the controller 190, the power supply circuit 170 may adjust the signal width of the first gate clock signal GW_CLK supplied to the first driving circuit 131.

The third period P3 (see FIGS. 4A and 4B) in which the data signal is written may be determined according to the signal width of the first gate signal GW. When the signal width of the first gate signal GW increases, the time for writing the data signal may increase and thus the luminance of the pixel PX may increase. Thus, the luminance deviation between the odd row and the even row may be minimized by adjusting the luminance of the pixels PX in the odd row and the luminance of the pixels PX in the even row by adjusting the signal width of the first gate signal GW supplied to the pixels PX in the odd row and the signal width of the first gate signal GW supplied to the pixels PX in the even row. In this case, the rising edge timing of each of the second gate clock signal GI_CLK, the third gate clock signal GR_CLK, the fourth gate clock signal EM_CLK, and the fifth gate clock signal EMB_CLK may be equal to each other. For example, the rising edge timing of the first gate clock signal GW_CLK may be 0 μs, and the rising edge timing of each of the second gate clock signal GI_CLK, the third gate clock signal GR_CLK, the fourth gate clock signal EM_CLK, and the fifth gate clock signal EMB_CLK may be 0.5 μs.

In an embodiment when the luminance of the pixels PX in the odd row is higher than the luminance of the pixels in the even row, a second signal width SW2 of first gate signals (GW[2], GW[4], . . . ) supplied to the pixels PX in the even row is greater than a first signal width SW1 of first gate signals (GW[1], GW[3], . . . ) supplied to the pixel in the odd row, as illustrated in FIG. 18. In an embodiment, the first signal width SW1 is greater than 1 horizontal period (1H) and less than 2 horizontal periods (2H). In an embodiment, the second signal width SW2 is greater than the first signal width SW1 and less than 2 horizontal periods (2H).

Similarly, when the luminance of the pixels PX in the even row is higher than the luminance of the pixels PX in the odd row, the second signal width SW2 of the first gate signals (GW[2], GW[4], . . . ) supplied to the pixels PX in the even row may be less than the first signal width SW1 of the first gate signals (GW[1], GW[3], . . . ) supplied to the pixels in the odd row.

In the above embodiments, outputting (or supplying) a certain signal may mean outputting (or supplying) the first-level voltage, and not outputting (or supplying) a certain signal may mean outputting (or supplying) the second-level voltage.

In the gate driving circuit according to an embodiment, a driving circuit outputting a gate signal for writing a data signal (e.g., a first driving circuit outputting a first gate signal GW) may include a plurality of stages in units of rows, and at least one driving circuit outputting a gate signal for initialization and compensation (e.g., a fourth driving circuit, a third driving circuit, a second driving circuit, and a fifth driving circuit outputting a second gate signal GI, a third gate signal GR, a fourth gate signal EM, and a fifth gate signal EMB) may include a plurality of stages in a two-stage common structure common to two rows. According to embodiments, the luminance deviation between the odd row and the even row may be minimized by adjusting the rising edge timing of a clock signal supplied to output at least one gate signal among the second gate signal GI, the third gate signal GR, the fourth gate signal EM, and the fifth gate signal EMB or by adjusting the signal width of a gate signal for writing a data signal.

Figure 19:
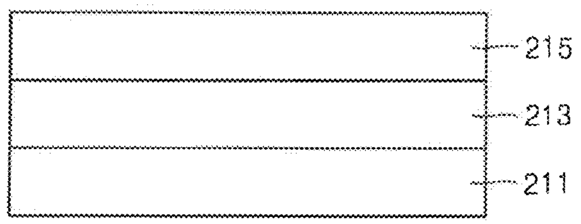
FIG. 19 is a cross-sectional view illustrating a structure of a display element according to an embodiment.

FIG. 19 is a cross-sectional view illustrating a structure of a display element according to an embodiment. FIGS. 20 to 25 are cross-sectional views illustrating a structure of a display element according to an embodiment.

Referring to FIG. 19, an organic light emitting diode OLED as a display element according to an embodiment may include a pixel electrode 211, an opposite electrode 215, and an intermediate layer 213 between the pixel electrode 211 (a first electrode or an anode) and the opposite electrode 215 (a second electrode or a cathode).

The pixel electrode 211 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the pixel electrode 211 may have a three-layer structure of ITO/Ag/ITO.

The opposite electrode 215 may be disposed over the intermediate layer 213. The opposite electrode 215 may include a metal with a low work function, an alloy, an electrically conductive compound, or any combination thereof. For example, the opposite electrode 215 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The opposite electrode 215 may be a transparent electrode, a semitransparent electrode, or a reflective electrode.

The intermediate layer 213 may include a high-molecular weight or low-molecular weight organic material for emitting light of a certain color. In addition to various organic materials, the intermediate layer 213 may further include a metal-containing compound such as an organometallic compound, or an inorganic material such as a quantum dot.

In an embodiment, the intermediate layer 213 includes an emission layer and a first functional layer and a second functional layer disposed under and over the emission layer respectively. For example, the first functional layer may include a hole transport layer (HTL) or may include an HTL and a hole injection layer (HIL). The second functional layer may include an electron transport layer (ETL) and/or an electron injection layer (EIL). The first functional layer or the second functional layer may be omitted. The first functional layer and the second functional layer may be integrally formed to correspond to a plurality of organic light emitting diodes OLED included in the display area DA.

In an embodiment, the intermediate layer 213 may include two or more emission units sequentially stacked between the pixel electrode 211 and the opposite electrode 213 and a charge generation layer (CGL) arranged between two emission units. When the intermediate layer 213 includes an emission unit and a charge generation layer, the organic light emitting diode OLED may be a tandem light emitting device. Because the organic light emitting diode OLED has a stack structure of a plurality of emission units, the color purity and the light emission efficiency thereof may be increased.

One emission unit may include an emission layer and a first functional layer and a second functional layer under and over the emission layer respectively. The charge generation layer (CGL) may include a negative charge generation layer and a positive charge generation layer. The light emission efficiency of the organic light emitting diode OLED that is a tandem light emitting device including a plurality of emission layers may be further improved by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 20:
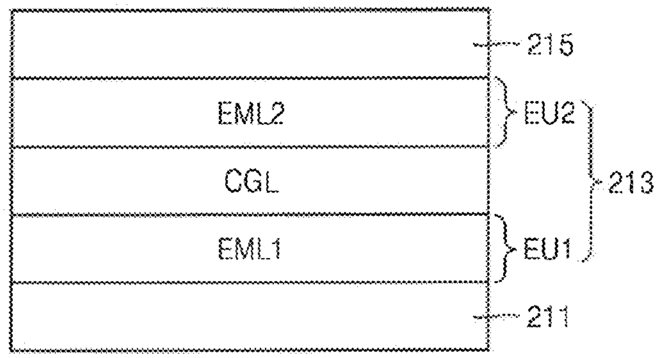
FIGS. 20 to 25 are cross-sectional views illustrating a structure of a display element according to an embodiment.

In an embodiment, as illustrated in FIG. 20, the organic light emitting diode OLED may include a first emission unit EU1 including a first emission layer EML1 and a second emission unit EU2 including a second emission layer EML2, which are sequentially stacked. The charge generation layer CGL may be provided between the first emission unit EU1 and the second emission unit EU2. For example, the organic light emitting diode OLED may include a pixel electrode 211, a first emission layer EML1, a charge generation layer CGL, a second emission layer EML2, and an opposite electrode 215 that are sequentially stacked. A first functional layer and a second functional layer may be included under and over the first emission layer EML1 respectively. A first functional layer and a second functional layer may be included under and over the second emission layer EML2 respectively. The first emission layer EML1 may be a blue emission layer, and the second emission layer EML2 may be a yellow emission layer.

Figure 21:
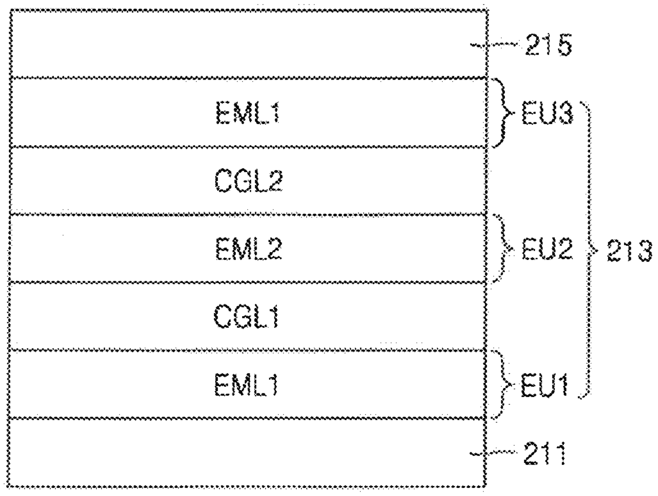

In an embodiment, as illustrated in FIG. 21, the organic light emitting diode OLED may include a first emission unit EU1 and a third emission unit EU3 each including a first emission layer EML1 and a second emission unit EU2 including a second emission layer EML2. A first charge generation layer CGL1 may be located between the first emission unit EU1 and the second emission unit EU2, and a second charge generation layer CGL2 may be located between the second emission unit EU2 and the third emission unit EU3. For example, the organic light emitting diode OLED may include a pixel electrode 211, a first emission layer EML1, a first charge generation layer CGL1, a second emission layer EML2, a second charge generation layer CGL2, a first emission layer EML1, and an opposite electrode 215 that are sequentially stacked. A first functional layer and a second functional layer may be disposed under and over the first emission layer EML1 respectively. A first functional layer and a second functional layer may be disposed under and over the second emission layer EML2 respectively. The first emission layer EML1 may be a blue emission layer, and the second emission layer EML2 may be a yellow emission layer.

In an embodiment, in the organic light emitting diode OLED, in addition to the second emission layer EML2, the second emission unit EU2 may further include a third emission layer EML3 and/or a fourth emission layer EML4 directly contacting under and/or over the second emission layer EML2. Here, directly contacting may mean that no other layer is arranged between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 22:
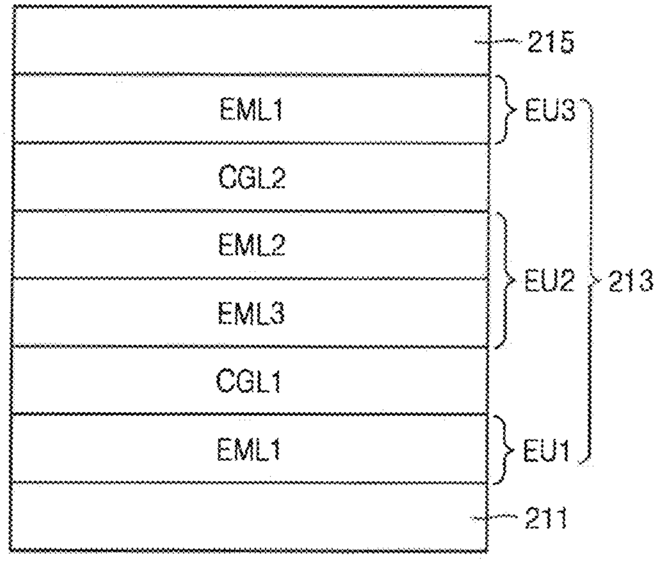

For example, as illustrated in FIG. 22, the organic light emitting diode OLED may include a pixel electrode 211, a first emission layer EML1, a first charge generation layer CGL1, a third emission layer EML3, a second emission layer EML2, a second charge generation layer CGL2, a first emission layer EML1, and an opposite electrode 215 that are sequentially stacked. Alternatively, as illustrated in FIG. 23, the organic light emitting diode OLED may include a pixel electrode 211, a first emission layer EML1, a first charge generation layer CGL1, a third emission layer EML3, a second emission layer EML2, a fourth emission layer EML4, a second charge generation layer CGL2, a first emission layer EML1, and an opposite electrode 215 that are sequentially stacked.

Figure 23:
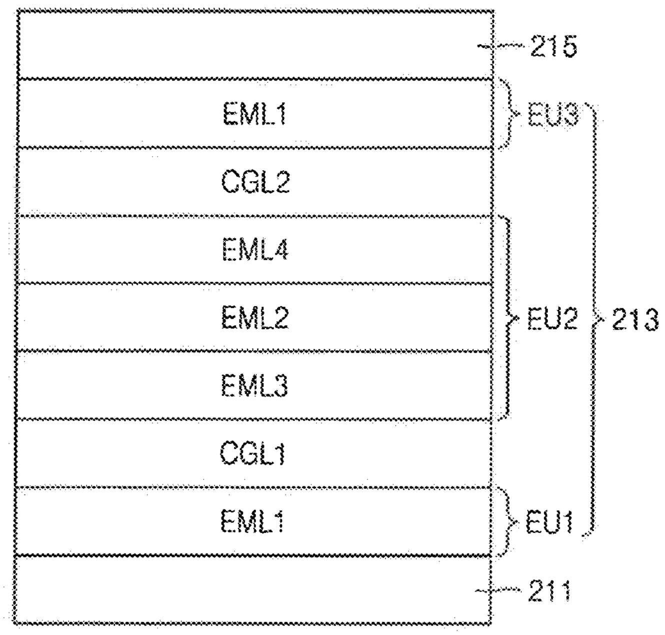
Figure 24:
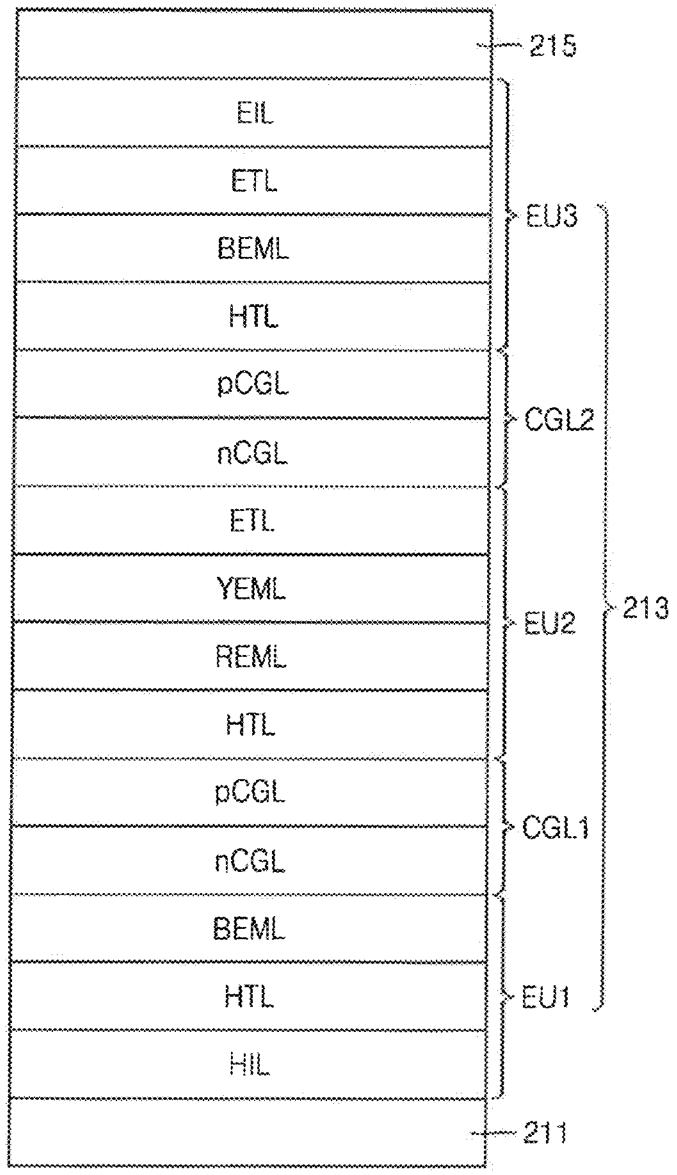
Figure 25:
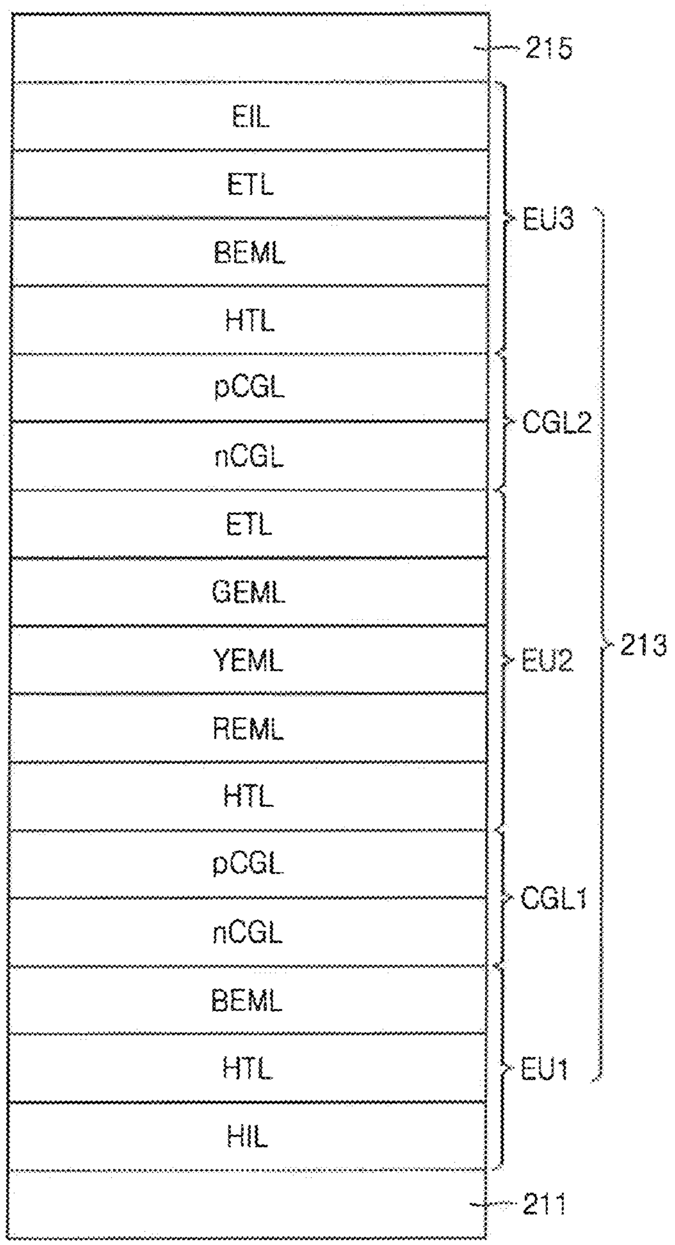

FIG. 24 is a cross-sectional view illustrating an example of the organic light emitting diode of FIG. 22, and FIG. 25 is a cross-sectional view illustrating an example of the organic light emitting diode of FIG. 23.

Referring to FIG. 24, the organic light emitting diode OLED may include a first emission unit EU1, a second emission unit EU2, and a third emission unit EU3 that are sequentially stacked. A first charge generation layer CGL1 may be provided between the first emission unit EU1 and the second emission unit EU2, and a second charge generation layer CGL2 may be provided between the second emission unit EU2 and the third emission unit EU3. Each of the first charge generation layer CGL1 and the second charge generation layer CGL2 may include a negative charge generation layer nCGL and a positive charge generation layer pCGL.

The first emission unit EU1 may include a blue emission layer BEML. The first emission unit EU1 may further include a hole injection layer HIL and a hole transport layer HTL between the pixel electrode 211 and the blue emission layer BEML. In an embodiment, a p-doped layer may be further included between the hole injection layer HIL and the hole transport layer HTL. The p-doped layer may be formed by doping the hole injection layer HIL with a p-type dopant. In an embodiment, at least one of a blue light auxiliary layer, an electron blocking layer, and a buffer layer may be further included between the blue emission layer BEML and the hole transport layer HTL. The blue light auxiliary layer may increase the light output efficiency of the blue emission layer BEML. The blue light auxiliary layer may adjust the hole charge balance to increase the light output efficiency of the blue emission layer BEML. The electron blocking layer may prevent the injection of electrons into the hole transport layer HTL. The buffer layer may compensate for the resonance distance depending on the wavelength of light emitted from the blue emission layer BEML.

The second emission unit EU2 may include a yellow emission layer YEML and a red emission layer REML directly contacting the yellow emission layer YEML under the yellow emission layer YEML. The second emission unit EU2 may further include a hole transport layer HTL between the red emission layer REML and the positive charge generation layer pCGL of the first charge generation layer CGL1 and may further include an electron transport layer ETL between the yellow emission layer YEML and the negative charge generation layer nCGL of the second charge generation layer CGL2.

The third emission unit EU3 may include a blue emission layer BEML. The third emission unit EU3 may further include a hole transport layer HTL between the blue emission layer BEML and the positive charge generation layer pCGL of the second charge generation layer CGL2. The third emission unit EU3 may further include an electron transport layer ETL and an electron injection layer EIL between the blue emission layer BEML and the opposite electrode 215. The electron transport layer ETL may include a single layer or multiple layers. In an embodiment, at least one of a blue light auxiliary layer, an electron blocking layer, and a buffer layer may be further included between the blue emission layer BEML and the hole transport layer HTL. At least one of a hole blocking layer and a buffer layer may be further included between the blue emission layer BEML and the electron transport layer ETL. The hole blocking layer may prevent the injection of holes into the electron transport layer ETL.

The organic light emitting diode OLED illustrated in FIG. 25 may be different from the organic light emitting diode OLED illustrated in FIG. 24 in terms of the stack structure of the second emission unit EU2, and other configurations thereof may be the same as those illustrated in FIG. 24. Referring to FIG. 25, the second emission unit EU2 may include a yellow emission layer YEML, a red emission layer REML directly contacting the yellow emission layer YEML under the yellow emission layer YEML, and a green emission layer GEML directly contacting the yellow emission layer YEML over the yellow emission layer YEML. The second emission unit EU2 may further include a hole transport layer HTL between the red emission layer REML and the positive charge generation layer pCGL of the first charge generation layer CGL1 and may further include an electron transport layer ETL between the green emission layer GEML and the negative charge generation layer nCGL of the second charge generation layer CGL2.

Figure 26:
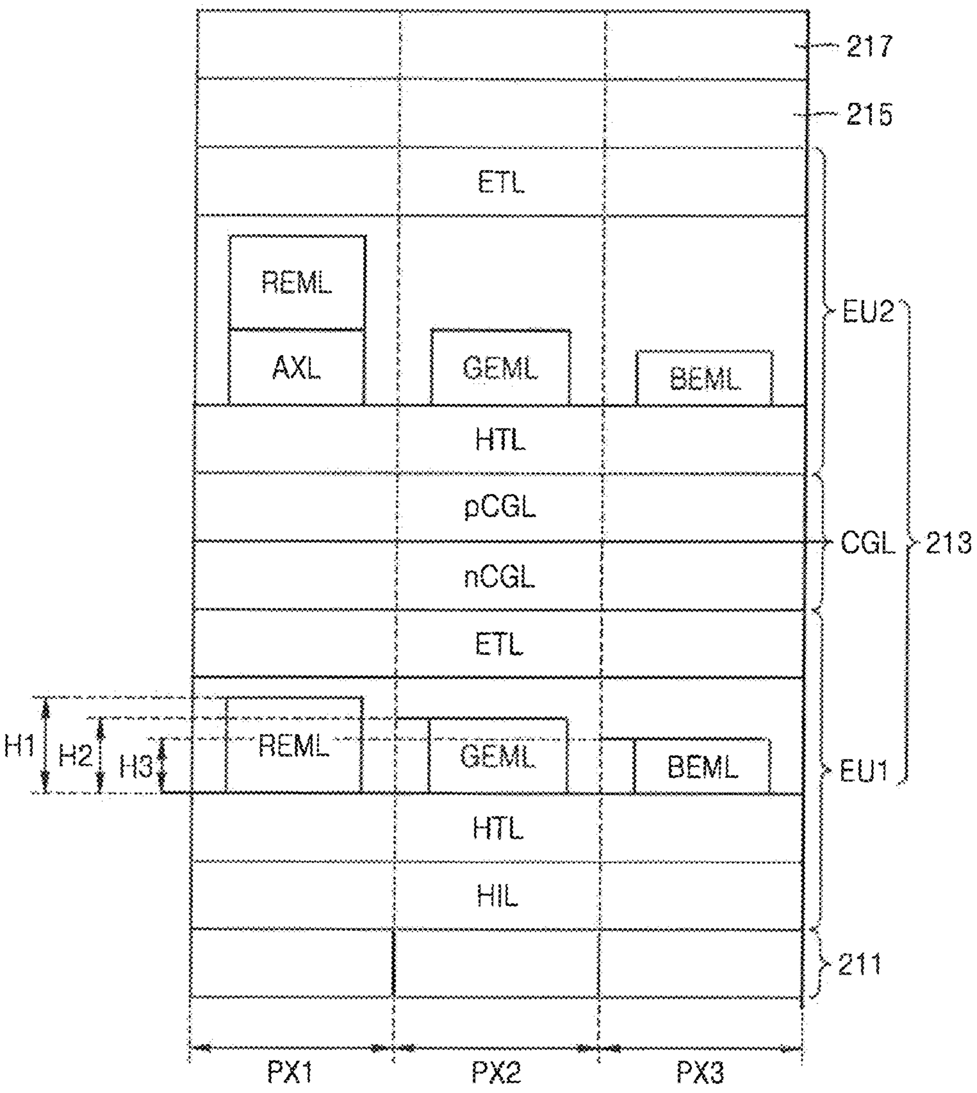
FIG. 26 is a cross-sectional view illustrating a structure of a pixel of a display apparatus according to an embodiment.

FIG. 26 is a cross-sectional view illustrating a structure of a pixel of a display apparatus according to an embodiment.

Referring to FIG. 26, the display apparatus may include a plurality of pixels. The plurality of pixels may include a first pixel PX1, a second pixel PX2, and a third pixel PX3. Each of the first pixel PX1, the second pixel PX2, and the third pixel PX3 may include a pixel electrode 211, an opposite electrode 215, and an intermediate layer 213. In an embodiment, the first pixel PX1 may be a red pixel, the second pixel PX2 may be a green pixel, and the third pixel PX3 may be a blue pixel. Here, each pixel may include an organic light emitting diode OLED as a display element, and the organic light emitting diode OLED of each pixel may be electrically connected to a pixel circuit.

The pixel electrode 211 may be independently provided in each of the first pixel PX1, the second pixel PX2, and the third pixel PX3.

The intermediate layer 213 of the organic light emitting diode OLED of each of the first pixel PX1, the second pixel PX2, and the third pixel PX3 may include a first emission unit EU1 and a second emission unit EU2, which are sequentially stacked, and a charge generation layer CGL between the first emission unit EU1 and the second emission unit EU2. The charge generation layer (CGL) may include a negative charge generation layer nCGL and a positive charge generation layer pCGL. The charge generation layer CGL may be a common layer continuously formed in the first pixel PX1, the second pixel PX2, and the third pixel PX3.

The first emission unit EU1 of the first pixel PX1 may include a hole injection layer HIL, a hole transport layer HTL, a red emission layer REML, and an electron transport layer ETL that are sequentially stacked over the pixel electrode 211. The first emission unit EU1 of the second pixel PX2 may include a hole injection layer HIL, a hole transport layer HTL, a green emission layer GEML, and an electron transport layer ETL that are sequentially stacked over the pixel electrode 211. The first emission unit EU1 of the third pixel PX3 may include a hole injection layer HIL, a hole transport layer HTL, a blue emission layer BEML, and an electron transport layer ETL that are sequentially stacked over the pixel electrode 211. Each of the hole injection layer HIL, the hole transport layer HTL, and the electron transport layer ETL of the first emission units EU1 may be a common layer continuously formed in the first pixel PX1, the second pixel PX2, and the third pixel PX3.

The second emission unit EU2 of the first pixel PX1 may include a hole transport layer HTL, an auxiliary layer AXL, a red emission layer REML, and an electron transport layer ETL that are sequentially stacked over the charge generation layer CGL. The second emission unit EU2 of the second pixel PX2 may include a hole transport layer HTL, a green emission layer GEML, and an electron transport layer ETL that are sequentially stacked over the charge generation layer CGL. The second emission unit EU2 of the third pixel PX3 may include a hole transport layer HTL, a blue emission layer BEML, and an electron transport layer ETL that are sequentially stacked over the charge generation layer CGL. Each of the hole transport layer HTL and the electron transport layer ETL of the second emission units EU2 may be a common layer continuously formed in the first pixel PX1, the second pixel PX2, and the third pixel PX3. In an embodiment, at least one of a hole blocking layer and a buffer layer may be further included between the emission layer and the electron transport layer ETL in the second emission unit EU2 of the first pixel PX1, the second pixel PX2, and the third pixel PX3.

A thickness H1 of the red emission layer REML, a thickness H2 of the green emission layer GEML, and a thickness H3 of the blue emission layer BEML may be determined according to the resonance distance. The auxiliary layer AXL may be a layer added to adjust the resonance distance and may include a resonance auxiliary material. For example, the auxiliary layer AXL may include the same material as the hole transport layer HTL.

In FIG. 26, the auxiliary layer AXL is included only in the first pixel PX1. However, embodiments of the disclosure are not limited thereto. For example, the auxiliary layer AXL may be included in at least one of the first pixel PX1, the second pixel PX2, and the third pixel PX3 to adjust the resonance distance of each of the first pixel PX1, the second pixel PX2, and the third pixel PX3.

The display apparatus may further include a capping layer 217 arranged outside the opposite electrode 215. The capping layer 217 may increase the light emission efficiency according to the principle of constructive interference. Accordingly, the light extraction efficiency of the organic light emitting diode OLED may be increased, and thus, the light emission efficiency of the organic light emitting diode OLED may be increased.

Embodiments of the disclosure may provide a display apparatus having an increased display quality by minimizing a luminance deviation thereof. However, the effects of the disclosure are not limited to the above effects and may be variously extended without departing from the spirit of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A driving circuit for outputting at least one gate signal to a pixel of a display panel, the driving circuit comprising:

a first driving circuit configured to receive a first clock signal and output a first gate signal with a gate-on voltage that occurs in response to a first rising edge of the first clock signal in a first period in which data is supplied to the pixel in a frame period;

a second driving circuit configured to receive a second clock signal and output a second gate signal with a gate-on voltage that occurs in response to a second rising edge of the second clock signal in a second period for initializing a driving transistor of the pixel in the frame period;

a third driving circuit configured to receive a third clock signal and output a third gate signal with a gate-on voltage that occurs in response to a third rising edge of the third clock signal in a third period for compensating for a threshold voltage of the driving transistor of the pixel in the frame period; and a fourth driving circuit configured to receive a fourth clock signal and output a fourth gate signal, wherein a fourth rising edge of the fourth clock signal occurs at a same time as the second rising edge or the third rising edge, and wherein the second rising edge occurs at a different time than the third rising edge.

2. The driving circuit of claim 1, wherein the first driving circuit comprises a plurality of first stages each configured to output the first gate signal to a corresponding pixel row of the display panel, the second driving circuit comprises a plurality of second stages each configured to simultaneously output the second gate signal to a corresponding pair of pixel rows of the display panel, and the third driving circuit comprises a plurality of third stages each configured to simultaneously output the third gate signal to a corresponding pair of pixel rows of the display panel.

3. The driving circuit of claim 1, wherein the second period precedes the first period, and the third period is between the first period and the second period.

4. The driving circuit of claim 1, wherein the fourth gate signal is output with a gate-on voltage that occurs in response to the fourth rising edge of the fourth clock signal in at least a portion of the second period and an emission period of the pixel, wherein a light emitting device of the pixel is initialized in the second period.

5. The driving circuit of claim 4, wherein the fourth driving circuit comprises a plurality of fourth stages each configured to simultaneously output the fourth gate signal to a corresponding pair of pixel rows of the display panel.

6. The driving circuit of claim 4, further comprising a fifth driving circuit configured to receive a fifth clock signal and output a fifth gate signal with a gate-on voltage synchronized with rising edge timing of the fifth clock signal in the third period and an emission period of the pixel, wherein a fifth rising edge of the fifth clock signal occurs at a same time as the second rising edge or the third rising edge.

7. The driving circuit of claim 6, wherein the fifth driving circuit comprises a plurality of fifth stages each configured to simultaneously output the fifth gate signal to a corresponding pair of pixel rows of the display panel.

8. The driving circuit of claim 1, wherein rising edge timing of the second clock signal is later than rising edge timing of the third clock signal.

9. The driving circuit of claim 8, wherein the rising edge timing of the second clock signal is 0.5 microseconds (μs), and the rising edge timing of the third clock signal is 1.5 μs.

10. The driving circuit of claim 1, wherein rising edge timing of the third clock signal is later than rising edge timing of the second clock signal.

11. The driving circuit of claim 10, wherein the rising edge timing of the third clock signal is 0.5 microseconds (μs), and the rising edge timing of the second clock signal is 1.5 μs.

12. The driving circuit of claim 1, wherein a signal width of the first gate signal output to an odd pixel row of the display panel is equal to a signal width of the first gate signal output to an even pixel row of the display panel.

13. The driving circuit of claim 1, wherein the rising edge timing of the first clock signal precedes the rising edge timing of the second clock signal and the rising edge timing of the third clock signal.

14. A driving circuit for outputting at least one gate signal to a pixel of a display panel, the driving circuit comprising:

a first driving circuit configured to receive a first clock signal and output a first gate signal with a gate-on voltage that occurs in response to a first rising edge of the first clock signal in a first period in which data is supplied to the pixel in a frame period;

a second driving circuit configured to receive a second clock signal and output a second gate signal with a gate-on voltage that occurs in response to a second rising edge of the second clock signal in a second period for initializing a driving transistor of the pixel in the frame period;

a third driving circuit configured to receive a third clock signal and output a third gate signal with a gate-on voltage that occurs in response to a third rising edge of the third clock signal in a third period for compensating for a threshold voltage of the driving transistor of the pixel in the frame period, wherein, in the first period, signal widths of the first gate signal output to odd pixel rows of the display panel are different from signal widths of the first gate signal output to even pixel rows of the display panel, and wherein the first gate signal output to a first odd pixel row of the odd pixel rows overlaps the first gate signal output to a first even pixel row of the even pixels, and the first gate signal output to the first even pixel row overlaps the first gate signal output to a second odd pixel row of the odd pixel rows.

15. The driving circuit of claim 14, wherein the rising edge timing of the second clock signal and the rising edge timing of the third clock signal are the same as each other, and the rising edge timing of the first clock signal precedes the rising edge timing of the second clock signal and the rising edge timing of the third clock signal.

16. The driving circuit of claim 15, wherein the fourth gate signal is output with a gate-on voltage that occurs in response to the fourth rising edge of the fourth clock signal in at least a portion of the second period and an emission period of the pixel, wherein a light emitting device of the pixel is initialized in the second period.

17. The driving circuit of claim 16, wherein the fourth driving circuit comprises a plurality of fourth stages each configured to simultaneously output the fourth gate signal to a corresponding pair of pixel rows of the display panel.

18. The driving circuit of claim 16, further comprising a fifth driving circuit configured to receive a fifth clock signal and output a fifth gate signal with a gate-on voltage that occurs in response to a fifth rising edge of the fifth clock signal in the third period and an emission period of the pixel, wherein the fifth rising edge occurs at a same time as the second rising edge.

19. The driving circuit of claim 18, wherein the fifth driving circuit comprises a plurality of fifth stages each configured to simultaneously output the fifth gate signal to a corresponding pair of pixel rows of the display panel.

20. The driving circuit of claim 14, wherein the first driving circuit comprises a plurality of first stages each configured to output the first gate signal to a corresponding pixel row of the display panel, the second driving circuit comprises a plurality of second stages each configured to simultaneously output the second gate signal to a corresponding pair of pixel rows of the display panel, and the third driving circuit comprises a plurality of third stages each configured to simultaneously output the third gate signal to a corresponding pair of pixel rows of the display panel.

* * * * *